(12) United States Patent
Kang et al.

(10) Patent No.: US 12,706,125 B2
(45) Date of Patent: Aug. 11, 2026

(54) SEMICONDUCTOR DEVICE INCLUDING DRIVER CIRCUIT FOR ADJUSTING DUTY RATIO

(71) Applicant: Samsung Electronics Co., Ltd., Suwon-si (KR)

(72) Inventors: Hyunsuk Kang, Suwon-si (KR); Jeongsu Lee, Suwon-si (KR); Eunji An, Suwon-si (KR); Jungjune Park, Suwon-si (KR); Chiweon Yoon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 192 days.

(21) Appl. No.: 18/406,726

(22) Filed: Jan. 8, 2024

(65) Prior Publication Data

US 2024/0347080 A1 Oct. 17, 2024

(30) Foreign Application Priority Data

Apr. 11, 2023 (KR) ........................ 10-2023-0047620

(51) Int. Cl.
*G11C 5/14* (2006.01)

(52) U.S. Cl.
CPC .................................... *G11C 5/147* (2013.01)

(58) Field of Classification Search
CPC ........... G11C 5/147; H03K 19/017509; H03K 19/01721; H03K 5/156
See application file for complete search history.

(56) References Cited

U.S. PATENT DOCUMENTS 8,269,540 B2 9/2012 Cook
8,331,165 B2 12/2012 Teramoto
9,583,162 B1 2/2017 Choi
9,748,956 B2 8/2017 Lee et al.
9,780,785 B2 * 10/2017 Hardee ................ G11C 7/1057
10,431,266 B2 10/2019 Muraoka et al.
11,232,051 B2 1/2022 Yamamoto et al.
12,327,603 B2 * 6/2025 An ....................... G11C 7/1048
2007/0063734 A1 * 3/2007 Huang ............. H03K 19/00361 326/81

(Continued)

FOREIGN PATENT DOCUMENTS

KR 10-2010-0123045 A 11/2010

*Primary Examiner* — Khamdan N. Alrobaie
(74) *Attorney, Agent, or Firm* — Muir Patent Law, PLLC

(57) ABSTRACT

A semiconductor device includes a first pull-up circuit connected between a first power node supplying a first power voltage and an output node through which a signal is output, and including a plurality of NMOS transistors; a second pull-up circuit connected in parallel to the first pull-up circuit between the first power node and the output node and including a plurality of PMOS transistors; and a control circuit outputting a first pull-up code to the first pull-up circuit and outputting the second pull-up code to the second pull-up circuit. In a first operating mode, the signal swings between a first low level lower than the first power voltage, and a first high level lower than ½ times the first power voltage, resistance of the first pull-up circuit is determined based on the first pull-up code, and resistance of the second pull-up circuit is determined based on the second pull-up code.

19 Claims, 18 Drawing Sheets

(56) References Cited

U.S. PATENT DOCUMENTS

2007/0201258 A1* 8/2007 Son .................... G11C 7/1051
257/664
2011/0128043 A1* 6/2011 Oh ................ H03K 19/018521
326/87
2011/0241726 A1* 10/2011 Kim .................. H04L 25/0298
326/30
2011/0267112 A1* 11/2011 Lee ............... H03K 19/018528
327/108
2015/0280692 A1* 10/2015 Jung ..................... H03K 3/015
327/109
2017/0346466 A1* 11/2017 Jung ..................... H03K 19/20
2018/0123593 A1 5/2018 Choi
2019/0139613 A1* 5/2019 Shin .................. G11C 16/0483
2020/0402592 A1* 12/2020 Shin ...................... H10B 43/35
2021/0027827 A1* 1/2021 Kim .................... G11C 7/1057
2021/0065753 A1 3/2021 Lee et al.
2022/0115046 A1* 4/2022 Kang .............. G11C 29/50008
2022/0328108 A1* 10/2022 Guo ........................ G11C 5/14
2023/0138561 A1* 5/2023 Shin .................... G11C 29/022
326/30

* cited by examiner

SEMICONDUCTOR DEVICE INCLUDING DRIVER CIRCUIT FOR ADJUSTING DUTY RATIO

CROSS-REFERENCE TO RELATED APPLICATION(S)

This application claims benefit of priority to Korean Patent Application No. 10-2023-0047620 filed on Apr. 11, 2023 in the Korean Intellectual Property Office, the disclosure of which is incorporated herein by reference in its entirety.

BACKGROUND

The present inventive concept relates to a semiconductor device.

Semiconductor devices may provide a driver and a receiver for exchanging a signal with an external semiconductor device. The driver may be connected to a pad outputting a signal, and may include a function of adjusting a swing range and a swing level of the output signal according to an operation mode. However, as the swing range and the swing level of the output signal are changed, a duty ratio of the output signal may be unintentionally changed, and in this case, a problem such as deterioration of signal integrity (SI) characteristics of the output signal or the like may occur. Therefore, it is desired to minimize deterioration of the SI characteristics of the output signal even when the swing range and the swing level of the output signal are changed.

SUMMARY

An aspect of the present inventive concept is to provide a semiconductor device capable of minimizing deterioration of SI characteristics by stably maintaining a duty ratio of an output signal, even when a swing level and a swing range of the output signal are changed according to an operation mode.

According to an aspect of the present inventive concept, a semiconductor device includes a pull-up circuit connected between a first power node supplying a first power voltage and an output node through which a signal is output; a pull-down circuit connected between a second power node supplying a second power voltage, lower than the first power voltage, and the output node; and a control circuit controlling the pull-up circuit and the pull-down circuit. The pull-up circuit includes a first pull-up circuit including a plurality of NMOS transistors connected between the first power node and the output node, and a second pull-up circuit including a plurality of PMOS transistors connected between the first power node and the output node. In a first operating mode of the semiconductor device, the signal swings between a first low level, corresponding to the second power voltage, and a first high level, lower than the first power voltage, the control circuit outputs a first pull-up code to the first pull-up circuit, and outputs a second pull-up code to the second pull-up circuit. At least one of the plurality of PMOS transistors of the second pull-up circuit is turned on based on the second pull-up code.

According to an aspect of the present inventive concept, a semiconductor device includes a first driver circuit configured to output a first signal to a first pad; a second driver circuit configured to output a second signal, complementary to the first signal, to a second pad, different from the first pad; and a control circuit configured to control the first driver circuit and the second driver circuit. The control circuit includes a buffer including input terminals connected to the first pad and the second pad and an output terminal outputting a digital signal based on a difference between the first signal and the second signal, an integrator configured to operate in response to the digital signal, a comparator configured to compare an output voltage of the integrator with a reference voltage, and a counter configured to output an N-bit code (where N is a natural number equal to or greater than 2) based on a comparison result of the comparator. Resistance of the pull-up circuit of the first driver circuit and resistance of the pull-up circuit of the second driver circuit are adjusted based on the N-bit code.

According to an aspect of the present inventive concept, a semiconductor device includes a pull-up circuit including a first pull-up circuit connected between a first power node supplying a first power voltage and an output node through which a signal is output, and including a plurality of NMOS transistors; a second pull-up circuit connected in parallel to the first pull-up circuit between the first power node and the output node and including a plurality of PMOS transistors; and a control circuit configured to output a first pull-up code to the first pull-up circuit and output a second pull-up code to the second pull-up circuit. In a first operating mode of the semiconductor device, the signal swings between a first low level corresponding to a second power voltage, lower than the first power voltage, and a first high level, lower than ½ times the first power voltage, resistance of the first pull-up circuit is determined based on the first pull-up code, and resistance of the second pull-up circuit is determined based on the second pull-up code. Total resistance of the pull-up circuit is less than the resistance of the first pull-up circuit and the resistance of the second pull-up circuit.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, embodiments of the present inventive concept will be described with reference to the accompanying drawings.

Figure 1:
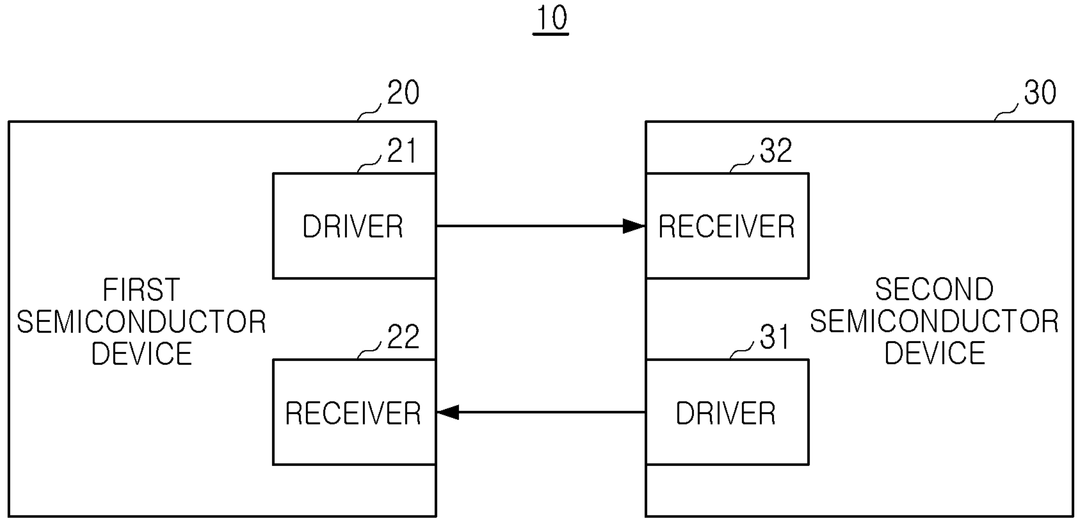
FIG. 1 is a schematic block diagram of a system including a semiconductor device according to an embodiment.

FIG. 1 is a schematic block diagram of a system including a semiconductor device according to an embodiment.

Referring to FIG. 1, a system 10 according to an embodiment may include a first semiconductor device 20 and a second semiconductor device 30 that exchange a signal. The first semiconductor device 20 and the second semiconductor device 30 may include a driver 21 and a driver 31 outputting the signal, and a receiver 22 and a receiver 32 receiving the signal, respectively. For example, in the system 10 illustrated in FIG. 1, the first semiconductor device 20 may be a host device such as an application processor, a central processing unit, a system-on-chip, or the like, and the second semiconductor device 30 may be a memory device that stores data. In this case, the driver 21 of the first semiconductor device 20 may include a data signal including data to be stored in the second semiconductor device 30, a control signal, a clock signal, or the like necessary for an operation of the second semiconductor device 30 may be output. The second semiconductor device 30 may read internally stored data based on the control signal and the clock signal, and the data signal including data may be input to the first semiconductor device 20 by the driver 31.

A signal transmitted between the first semiconductor device 20 and the second semiconductor device 30 may be a signal that transitions between two or more levels. A level of the signal may be determined by an operation of a pull-up circuit and an operation of a pull-down circuit, included in the drivers 21 and 31. As an example, the pull-up circuit may be a circuit connected between an output node from which a signal is output and a first power node supplying a first power voltage, and the pull-down circuit may be a circuit connected between a second power node supplying a second power voltage, lower than the first power voltage, and the output node.

For example, a level of a signal may increase when the pull-up circuit is turned on, and a level of a signal may decrease when the pull-down circuit is turned on. Each of the first semiconductor device 20 and the second semiconductor device 30 may internally generate a control code for controlling the pull-up circuit and the pull-down circuit, and a level of a signal output from the drivers 21 and 31 may be determined by the control code.

To improve signal integrity (SI) characteristics of a signal transmitted between the first semiconductor device 20 and the second semiconductor device 30 and increase an eye margin, a ZQ calibration operation may be executed in at least one of the first semiconductor device 20 or the second semiconductor device 30. The ZQ calibration operation may include an operation of adjusting resistance of the drivers 21 and 31, to minimize signal reflection due to mismatch in resistance. For example, in the ZQ calibration operation, resistance of the pull-up circuit and/or resistance of the pull-down circuit, included in the drivers 21 and 31, may be adjusted, and accordingly, intensity of the signal output from the drivers 21 and 31 may be changed. Herein, the resistance of the driver 21 or 31 may be on-resistance of the driver 21 or 31 through which a current flows.

In addition, characteristics of signals transmitted between the first semiconductor device 20 and the second semiconductor device 30 may be changed depending on respective operation modes of the first semiconductor device 20 and the second semiconductor device 30. For example, when the first semiconductor device 20 is a host device and the second semiconductor device 30 is a memory device, a swing range, a swing level, or the like of a signal output from the driver 31 may be changed depending on a command from the first semiconductor device 20.

In an embodiment, the driver 31 of the second semiconductor device 30 may operate in a center tapped termination (CTT) scheme or a low tapped termination (LTT) scheme according to a command from the first semiconductor device 20. Herein, the second semiconductor device 30 is operated in a first operating mode when the driver 31 uses the LTT scheme and the second semiconductor device 30 is operated in a second operating mode when the driver 31 uses the CTT scheme. A swing level of a signal output by the driver 31 in the CTT scheme may be higher than a swing level of a signal output by the driver 31 in the LTT scheme. Therefore, power consumption may be reduced while the driver 31 operates in the LTT scheme.

When the driver 31 operates in the LTT scheme, a problem in which a level of a signal does not increase rapidly enough may occur in a rising period in which the level of the signal output from the driver 31 increases. In this case, the SI characteristics of the signal may deteriorate, and the eye margin may decrease. Therefore, in an embodiment, it is possible to minimize degradation of the SI characteristic of the signal by adaptively adjusting the resistance of the pull-up circuit.

For example, when a duty ratio of the signal output from the driver 31 is low, the resistance of the pull-up circuit may be reduced to rapidly increase a level of a signal in the rising period. When a duty ratio of the signal output from the driver 31 is too high, a rate at which the signal level increases in the rising period may be slowed down by increasing the resistance of the pull-up circuit. As described above, in an embodiment, the SI characteristics of the signal may be improved by adaptively adjusting the resistance of the pull-up circuit according to the duty ratio of the signal.

Figure 2:
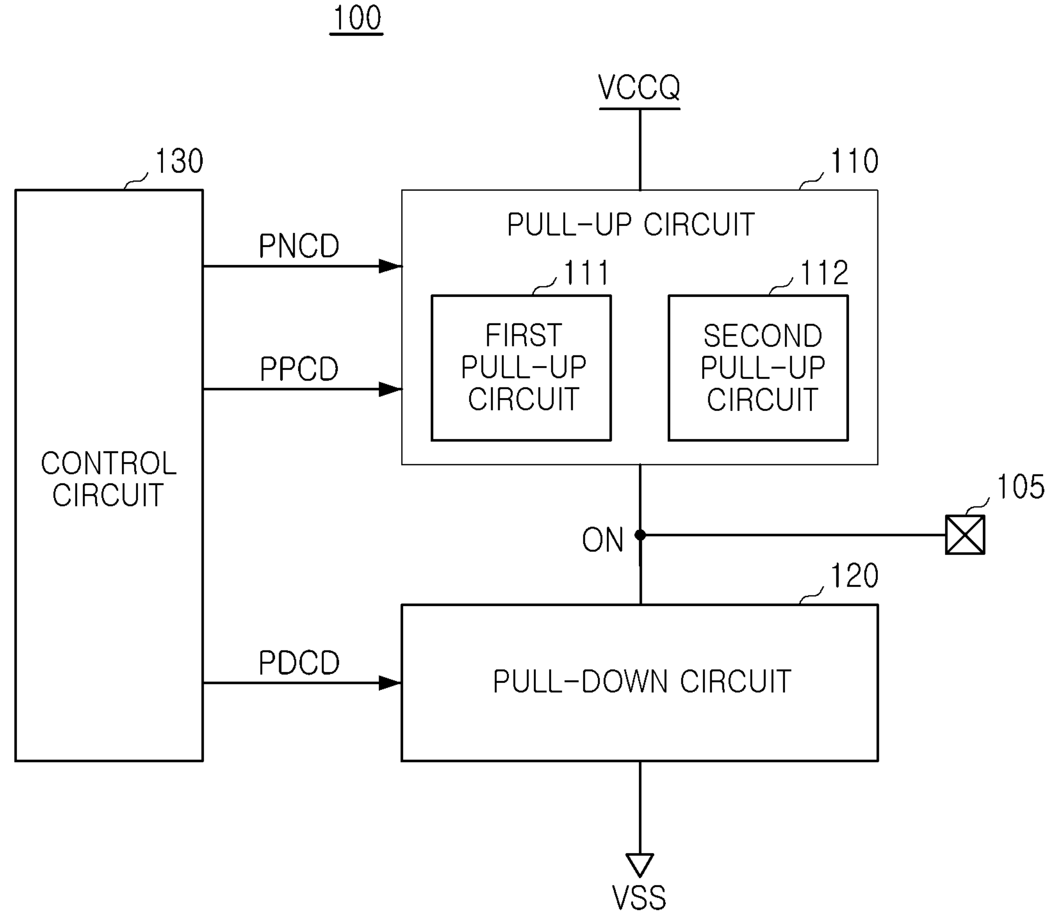
FIG. 2 is a schematic block diagram of a semiconductor device according to an embodiment.

FIG. 2 is a schematic block diagram of a semiconductor device according to an embodiment.

Referring to FIG. 2, a semiconductor device 100 according to an embodiment may include a driver outputting a signal to an output pad 105, a control circuit 130 controlling the driver, and the like. The driver may include an output node ON connected to the output pad 105, a pull-up circuit 110 connected between a first power node supplying a first power voltage VCCQ and the output node ON, a pull-down circuit 120 connected between a second power node supplying a second power voltage VSS and the output node ON, and the like. A level of the first power voltage VCCQ may be higher than a level of the second power voltage VSS. Herein, for convenience of description, the terms of the second power voltage VSS, a ground level, and a ground voltage GND may be used interchangeably.

Each of the pull-up circuit 110 and the pull-down circuit 120 may include a plurality of switch devices (e.g., transistors) providing a plurality of current paths arranged in parallel with each other. For example, a plurality of current paths provided by the pull-up circuit 110 may be connected in parallel between the first power node and the output node ON. Also, the plurality of current paths may flow currents having different magnitudes. For example, a magnitude of a current flowing through a first current path may be smaller than a magnitude of a current flowing through a second current path.

The control circuit 130 may output pull-up codes PNCD and PPCD to the pull-up circuit 110, and may output a pull-down code PDCD to the pull-down circuit 120. Whether a first pull-up circuit 111 and a second pull-up circuit 112, included in the pull-up circuit 110, are respectively activated may be determined by the pull-up codes PNCD and PPCD, and whether the pull-down circuit 120 is activated may be determined by the pull-down code PDCD.

For example, when the pull-up circuit 110 is activated, a level of a signal output to the output node ON may increase, and when the pull-down circuit 120 is activated, a level of a signal output to the output node ON may decrease. A voltage level respectively corresponding to a high level and a low level of the signal may be changed according to a termination method of an external semiconductor device connected through the output pad 105, and/or a resistance value of a termination resistor, or the like.

For example, each of the pull-up circuit 110 and the pull-down circuit 120 may include a plurality of switch devices (e.g., transistors) providing a plurality of current paths. Referring to the pull-down circuit 120 as an example, turn-on and turn-off of each of the plurality of switch devices included in the pull-down circuit 120 may be determined by the pull-down code PDCD. While a ZQ calibration operation is executed, the pull-down code PDCD may be set as a code capable of optimizing a resistance value of the pull-down circuit 120.

The pull-up circuit 110 may include a first pull-up circuit 111 and a second pull-up circuit 112, implemented with different devices. For example, the first pull-up circuit 111 may be implemented with n-channel metal-oxide semiconductor (NMOS) transistors, and the second pull-up circuit 112 may be implemented with p-channel MOS (PMOS) transistors. A first pull-up code PNCD may be input to the first pull-up circuit 111, and the first pull-up code PNCD may be determined by the ZQ calibration operation, like the pull-down code PDCD.

A second pull-up code PPCD input to the second pull-up circuit 112 may be determined differently according to setting of the signal output to the output node ON. For example, when a termination method of the output pad 105 is an LTT scheme, the control circuit 130 may adjust the second pull-up code PPCD to set a duty ratio of a signal as a value of 50% or a value close to 50%. For example, the second pull-up code PPCD may not have a fixed code determined in the ZQ calibration operation. In an embodiment, when a duty ratio of a signal output to the output node ON is less than 50%, the control circuit 130 may change a value of the second pull-up code PPCD to decrease a total resistance value of the pull-up circuit 110. When a duty ratio of a signal output to the output node ON is greater than 50%, the control circuit 130 may change a value of the second pull-up code PPCD to increase a total resistance value of the pull-up circuit 110. In an embodiment, in a self-calibration operation after performing the ZQ calibration operation, the control circuit 130 may output the second pull-up code PPCD to set a duty ratio of the signal of the output node ON as a value 50%.

Figure 3:
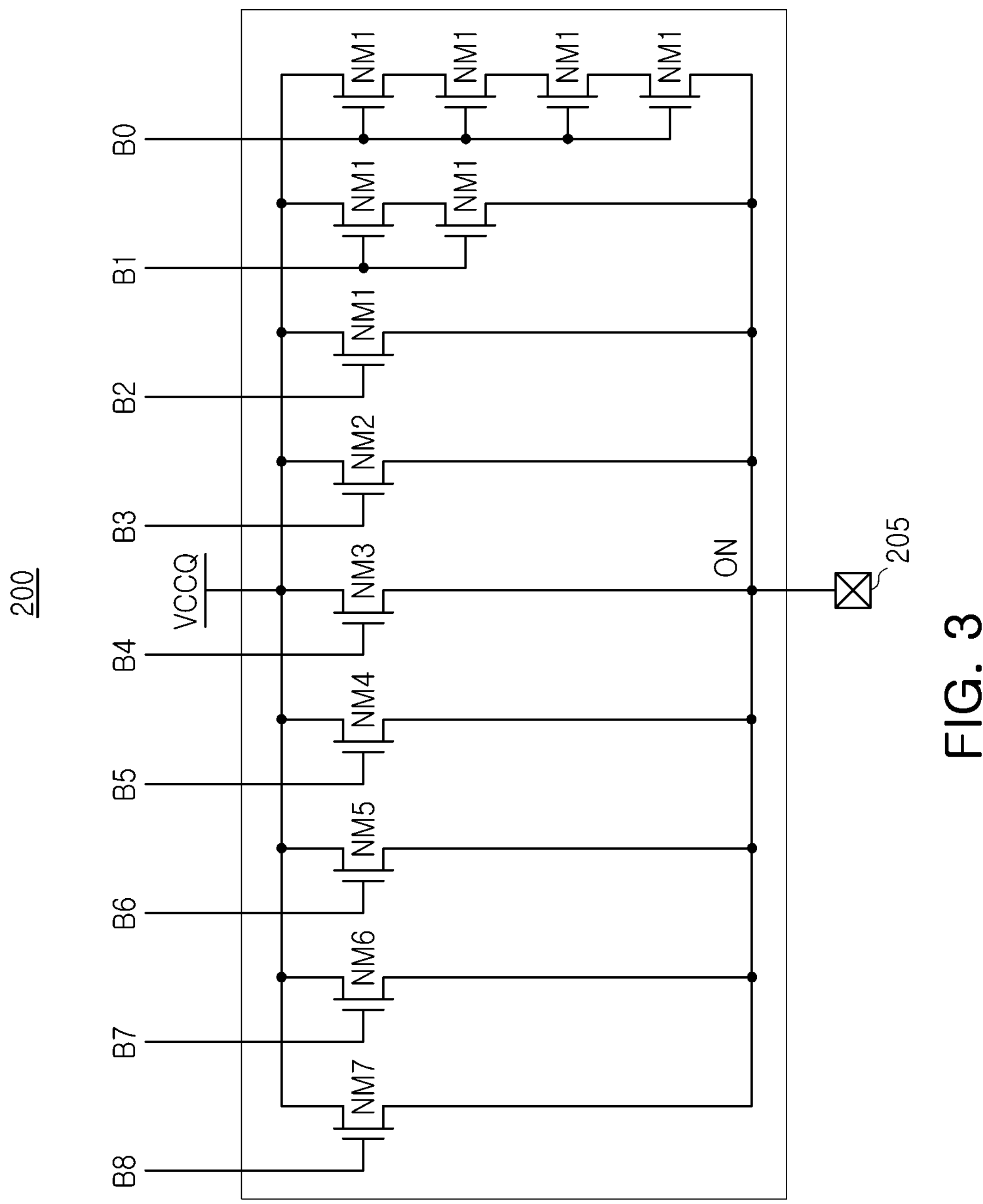
FIGS. 3 and 4 are circuit diagrams schematically illustrating pull-up circuits included in a semiconductor device according to an embodiment.
Figure 4:
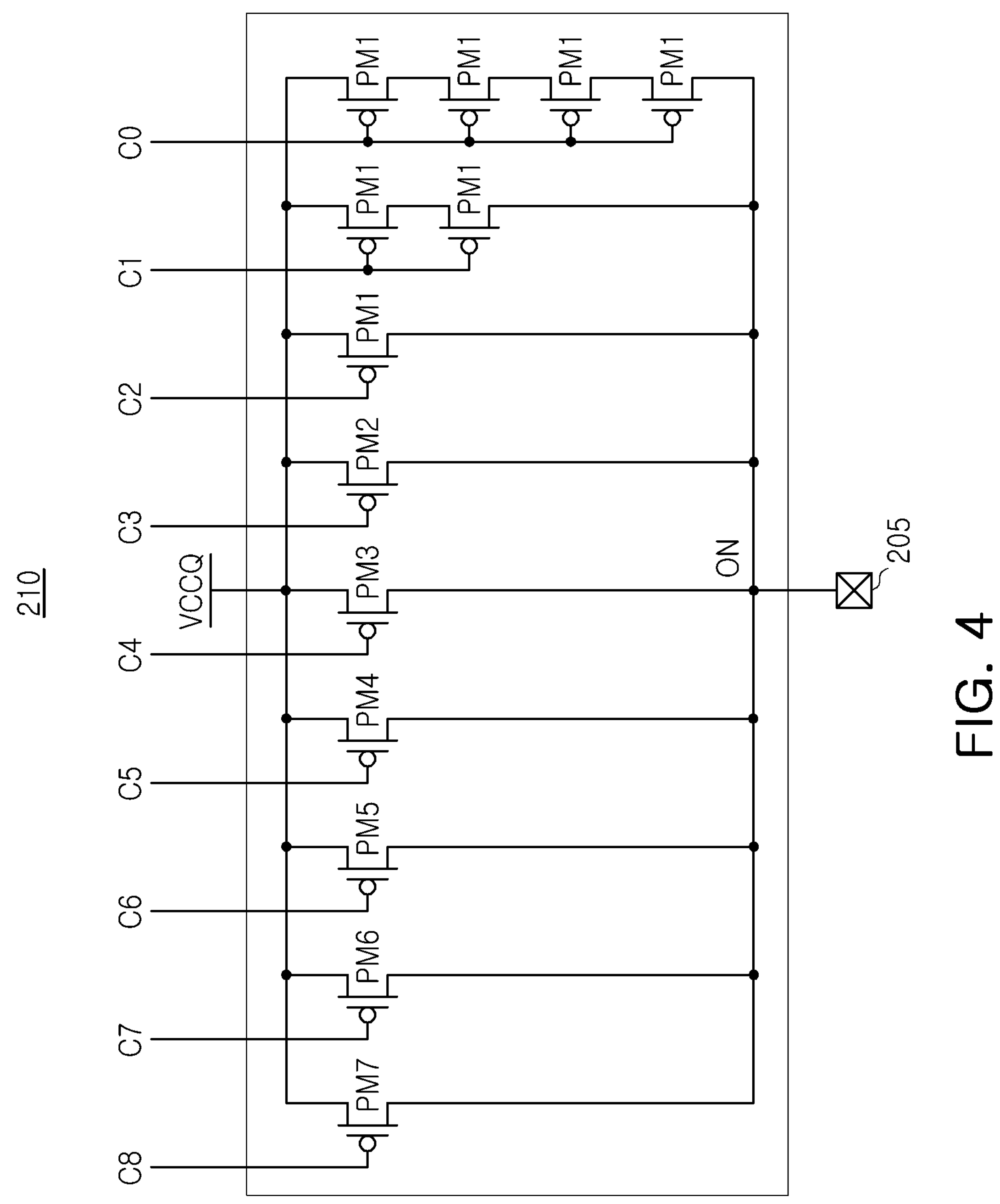

FIGS. 3 and 4 are circuit diagrams schematically illustrating pull-up circuits included in a semiconductor device according to an embodiment.

FIG. 3 is a circuit diagram simply illustrating a first pull-up circuit 200 implemented with NMOS transistors, and FIG. 4 is a circuit diagram simply illustrating a second pull-up circuit 210 implemented with PMOS transistors. Referring to FIGS. 3 and 4, the first pull-up circuit 200 and the second pull-up circuit 210 may be connected between a first power node supplying a first power voltage VCCQ and an output node ON. Therefore, the first pull-up circuit 200 and the second pull-up circuit 210 may be connected in parallel between the first power node and the output node ON. The output node ON may be connected to an output pad 205, and the output pad 205 may be electrically connected to a pad of an external semiconductor device through a channel. Referring first to FIG. 3, the first pull-up circuit 200 may include a plurality of NMOS transistors NM1 to NM7 connected between a first power node supplying a first power voltage VCCQ and an output node ON connected to an output pad 205. In an embodiment, a pull-down circuit connected between a second power node supplying a second power voltage, lower than the first power voltage VCCQ, and the output pad 205 may be implemented as a structure similar to the circuit diagram illustrated in FIG. 3.

At least some of the plurality of NMOS transistors NM1 to NM7 may be electrically connected in parallel to each other, and thus a plurality of current paths may be formed between the first power node and the output node ON. In the embodiment illustrated in FIG. 3, the first pull-up circuit 200 may provide first to ninth current paths. The first to ninth current paths may be activated or deactivated by first to ninth control signals B0 to B8, and resistance of the first pull-up circuit 200 may be changed depending on whether each of the current paths is activated.

In the embodiment illustrated in FIG. 3, the first current path may be provided by four first NMOS transistors NM1, the second current path may be provided by two first NMOS transistors NM1, and the third current path may be provided by a single first NMOS element NM1. The fourth current path may be provided by a second NMOS transistor NM2, the fifth current path may be provided by a third NMOS transistor NM3, the sixth current path may be provided by a fourth NMOS transistor NM4, and the seventh current path may be provided by a fifth NMOS transistor NM5. The eighth current path may be provided by a sixth NMOS transistor NM6, and the ninth current path may be provided by a seventh NMOS transistor NM7.

When the NMOS transistors NM1 to NM7 providing each of the current paths are turned on, currents flowing through the first to ninth current paths may be different from each other. For example, a magnitude of a current flowing in the fourth current path when the second NMOS transistor NM2 is turned on may be different from a magnitude of a current flowing in the fifth current path when the third NMOS transistor NM3 is turned on. For example, assuming that all of the NMOS transistors NM1 to NM7 are turned on a magnitude of a current flowing through the first current path may be the smallest, and a magnitude of a current flowing through the ninth current path may be greatest. This can also be understood as the fact that the first current path has the largest on-resistance, and the ninth current path has the smallest on-resistance.

At least some of the plurality of NMOS transistors NM1 to NM7 may be implemented as transistors having different aspect ratios. For example, the first NMOS transistor NM1 may have the smallest aspect ratio, and the seventh NMOS transistor NM7 may have the largest aspect ratio. Therefore, among the plurality of NMOS transistors NM1 to NM7, the first NMOS transistor NM1 may have the largest on-resistance, and the seventh NMOS transistor NM7 may have the smallest on-resistance.

If on-resistance of the first NMOS transistor NM1 is defined as Ron, on-resistance of each of the first to ninth current paths included in the first pull-up circuit 200 may be as illustrated in Table 1 below.

TABLE 1

| Current Path | 1st | 2nd | 3rd | 4th | 5th | 6th | 7th | 8th | 9th |
|---|---|---|---|---|---|---|---|---|---|
| On-Resistance | 4*Ron | 2*Ron | Ron | Ron/2 | Ron/4 | Ron/8 | Ron/16 | Ron/32 | Ron/64 |

The first to ninth control signals B0 to B8 for determining on/off of each of the plurality of NMOS transistors NM1 to NM7 may be determined by a first pull-up code input to the first pull-up circuit 200. For example, the first pull-up code may include 9-bit data, and nine (9) bits included in the first pull-up code may be sequentially matched to the first to ninth control signals B0 to B8.

For example, the first control signal B0 may be determined by the least significant bit of the first pull-up code, and the ninth control signal B8 may be determined by the most significant bit of the first pull-up code. Therefore, a resistance value of the first pull-up circuit 200 may be determined by the first pull-up code output to the first pull-up circuit 200 by a control circuit.

According to the embodiment illustrated in FIG. 4, a second pull-up circuit 210 may include a plurality of PMOS transistors PM1 to PM7 connected between the first power node supplying the first power voltage VCCQ and the output node ON connected to the output pad 205. At least some of the plurality of PMOS transistors PM1 to PM7 may be electrically connected in parallel to provide a plurality of current paths between the first power node and the output node ON, and on-resistance of each of the plurality of current paths may be different from each other.

On/off of each of the plurality of PMOS transistors PM1 to PM7 included in the second pull-up circuit 210 may be determined by a second pull-up code provided by a control circuit. The second pull-up code may be 9-bit data, and nine (9) bits included in the second pull-up code may be sequentially matched to first to ninth control signals C0 to C8.

At least some of the plurality of PMOS transistors PM1 to PM7 may be implemented as transistors having different aspect ratios. For example, the first PMOS transistor PM1 may have the smallest aspect ratio, and the seventh PMOS transistor PM7 may have the largest aspect ratio. Therefore, among the plurality of PMOS transistors PM1 to PM7, the first PMOS transistor PM1 may have the largest on-resistance, and the seventh PMOS transistor PM7 may have the smallest on-resistance.

The control circuit may independently generate the first pull-up code and the second pull-up code. Therefore, the first pull-up code and the second pull-up code may be different from each other. Also, unlike those illustrated in FIGS. 3 and 4, the first pull-up circuit 200 and the second pull-up circuit 210 may have different structures. For example, the number of current paths provided by the NMOS transistors NM1 to NM7 of the first pull-up circuit 200 may be different from the number of current paths provided by the PMOS transistors PM1 to PM7 of the second pull-up circuit 210.

Figure 5:
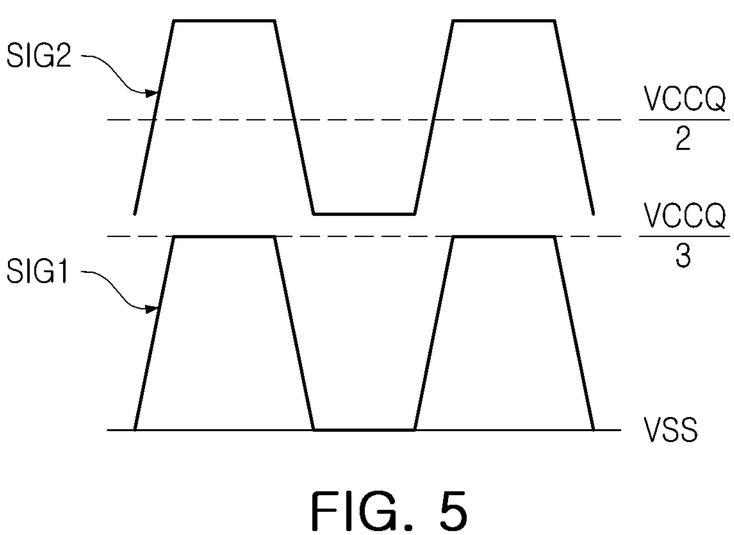
FIGS. 5 to 7 are views illustrating an operation of a semiconductor device according to embodiments.
Figure 6:
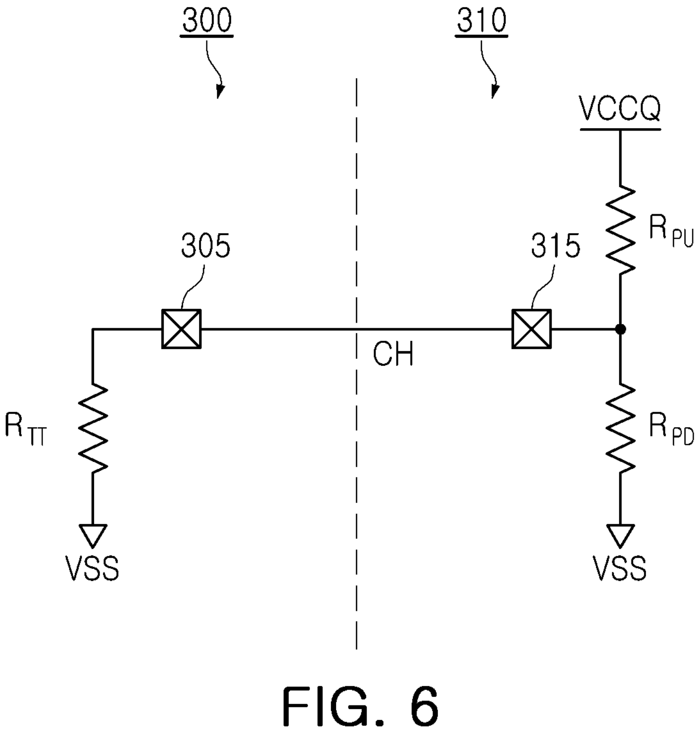
Figure 7:
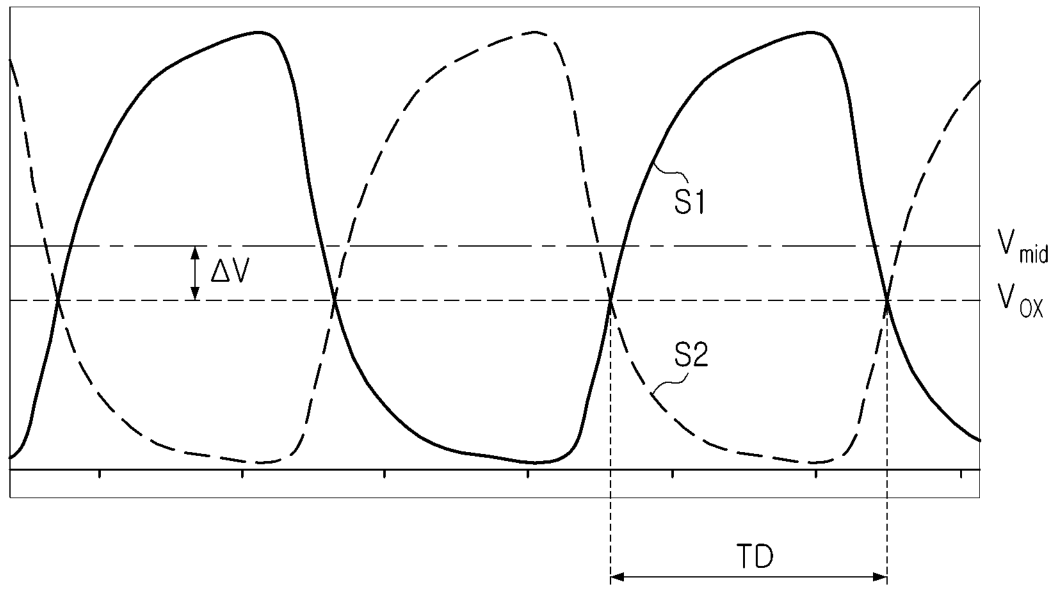

FIGS. 5 to 7 are views illustrating an operation of a semiconductor device according to embodiments.

FIG. 5 is a graph illustrating a swing shape of a signal according to a termination scheme of a channel through which the signal is transmitted and received. In the graph illustrated in FIG. 5, a driver outputting a signal may operate by receiving a first power voltage VCCQ and a second power voltage VSS.

A first output signal SIG1 may be a signal output when a channel outputting the signal is terminated in an LTT scheme. A second output signal SIG2 may be a signal output when a channel outputting the signal is terminated in a CTT scheme. As illustrated in FIG. 5, a swing range of the second output signal SIG2 according to the CTT scheme and a swing range of the first output signal SIG1 according to the LTT scheme may be substantially equal to each other.

Power consumption of a semiconductor device outputting a signal may be relatively less in the LTT scheme. Referring to FIG. 5, the first output signal SIG1 according to the LTT scheme may swing between a first low level corresponding to the second power voltage VSS and a first high level (VCCQ/3 in the embodiment illustrated in FIG. 5) less than ½ times the first power voltage VCCQ. The second output signal SIG2 according to the CTT scheme may swing between a second low level (VCCQ/3) higher than the second power voltage VSS and a second high level (VCCQ*⅔ in the embodiment illustrated in FIG. 5) higher than ½ times the first power voltage VCCQ. Therefore, when a signal is output in the LTT scheme, the semiconductor device may operate with relatively less power consumption.

FIG. 6 is an equivalent circuit diagram illustrating an operation between a first semiconductor device 300 and a second semiconductor device 310, when an LTT type termination is applied. In the embodiment illustrated in FIG. 6, the first semiconductor device 300 may receive a signal, and the second semiconductor device 310 may transmit the signal. For example, the first semiconductor device 300 may be a host device such as a central processing unit, an application processor, or the like, and the second semiconductor device 310 may be a memory device storing data.

A receiving pad 305 of the first semiconductor device 300 may be connected to an output pad 315 of the second semiconductor device 310, and a channel CH transmitting and receiving the signal may be formed between the receiving pad 305 and the output pad 315. When the first semiconductor device 300 is a host device and the second semiconductor device 310 is a memory device, a termination method of the channel between the first semiconductor device 300 and the second semiconductor device 310 may be determined by the first semiconductor device 300.

As illustrated in FIG. 6, when the channel CH is terminated in an LTT scheme, the receiving pad 305 may be connected to a second power node supplying a second power voltage VSS by a termination resistor $R_{TT}$. The output pad 315 may be connected to a first power node supplying a first power voltage VCCQ through a pull-up circuit, and may be connected to a second power node through a pull-down circuit. In the equivalent circuit illustrated in FIG. 6, the pull-up circuit may be expressed as a pull-up resistor $R_{PU}$, and the pull-down circuit may be expressed as a pull-down resistor $R_{PD}$.

For example, when a pull-up code corresponding to an activated code is not input to the pull-up circuit and a pull-down code corresponding to an activated code is input to the pull-down circuit, a voltage level of a signal transmitted to the channel CH may be reduced to the second power voltage VSS. When the pull-up code corresponding to an activated code is input to the pull-up circuit and the pull-down code is not input corresponding to an activated code to the pull-down circuit, a resistance divider circuit including the pull-up resistor $R_{PU}$ and the termination resistor $R_{TT}$ may be formed between the second power node of the first semiconductor device 300 and the first power node of the second semiconductor device 310, to increase a voltage level of a signal transmitted through the channel CH. As an example, the voltage level of the signal transmitted through the channel CH may be determined as illustrated in Equation 1 below. In Equation 1, it is assumed that the second power voltage VSS is at a ground level.

$$SCH = \frac{R_{TT}}{R_{PU} + R_{TT}} * VCCQ \quad \text{[Equation 1]}$$

Therefore, when a resistance value of the pull-up resistor $R_{PU}$ is set to twice a resistance value of the termination resistor $R_{TT}$, a signal having a swing range and a swing level, equal to those of the first signal SIG1 illustrated in FIG. 5 may be transmitted to the channel CH. When a resistance value of the pull-up resistor $R_{PU}$ is set to be twice a resistance value of the termination resistor $R_{TT}$, as the resistance value of the pull-up resistor $R_{PU}$ increases, a rate at which a voltage level of a signal transmitted to the channel CH increases in a rising period may be slowed down. For example, the rising period of the signal may increase to decrease a duty ratio of the signal, and as illustrated in FIG. 7, SI characteristics of the signal may deteriorate.

Referring to FIG. 7, a first signal S1 and a second signal S2, having a complementary relationship having a phase difference of 180 degrees, are illustrated. The first signal S1 and the second signal S2 may be output from output pads terminated in an LTT scheme, respectively, and the first signal S1 may be output from a first output pad, and the second signal S2 may be output from a second output pad.

As described above, when the termination of the LTT scheme is applied, a resistance value of a pull-up resistor $R_{PU}$ may be set to twice a resistance value of a termination resistor $R_{TT}$ to limit high levels of the signals S1 and S2 to a predetermined voltage level or less. In this manner, as the resistance value of the pull-up resistor $R_{PU}$ increases, a problem in that a rising period of the first signal S1 and a rising period of the second signal S2 increase may occur.

When the rising period increases, a rate at which the first signal S1 and the second signal S2 increases to a high level may decrease, and thus, as illustrated in FIG. 7, a crossover voltage $V_{OX}$ at which the first signal S1 and the second signal S2 crosses may be formed below an intermediate voltage $V_{mid}$, which may be a crossover voltage in an ideal case. In the embodiment illustrated in FIG. 7, as the crossover voltage $V_{OX}$ decreases by a voltage difference ΔV compared to the intermediate voltage $V_{mid}$, a duty ratio TD of each of the signals S1 and S2 may be reduced below 50%, which may be a duty ratio in an ideal case.

In an embodiment, to solve such a problem, a second pull-up circuit including PMOS transistors, which has not been used in the past, may be used in the termination of the LTT scheme. As an example, a pull-up resistor $R_{PU}$ of a first pull-up circuit including NMOS transistors may be set to twice a value determined by a ZQ calibration operation, for example, a resistance value of a termination resistor $R_{TT}$, and may determine whether to activate the second pull-up circuit according to whether the duty ratio TD of the signals S1 and S2 is less than 50%.

For example, when a duty ratio TD of at least one of the signals S1 and S2 is less than 50%, a second pull-up code may be input to the second pull-up circuit to activate the second pull-up circuit. In an embodiment, a resistance value of the pull-up circuit by using the second pull-up circuit additionally operated by the second pull-up code may be smaller than a resistance value of the pull-up circuit by using the first pull-up circuit receiving a first pull-up code determined by a ZQ calibration operation. Therefore, a total resistance of a pull-up circuit including the first pull-up circuit and the second pull-up circuit may be reduced, thereby an effect shortening a rising period of the signals S1 and S2 to increase a duty ratio TD may be obtained. For example, a total resistance of the pull-up circuit may be less than the resistance of the first pull-up circuit and the resistance of the second pull-up circuit.

When termination of a CTT scheme is applied, a fixed code may be input as the second pull-up code to the second pull-up circuit. In the CTT scheme, the second pull-up code input to the second pull-up circuit may be determined as a value that may limit high level of the signals S1 and S2 to a predetermined voltage level, for example, VCCQ*⅔ in the embodiment described with reference to FIG. 5.

Figure 8:
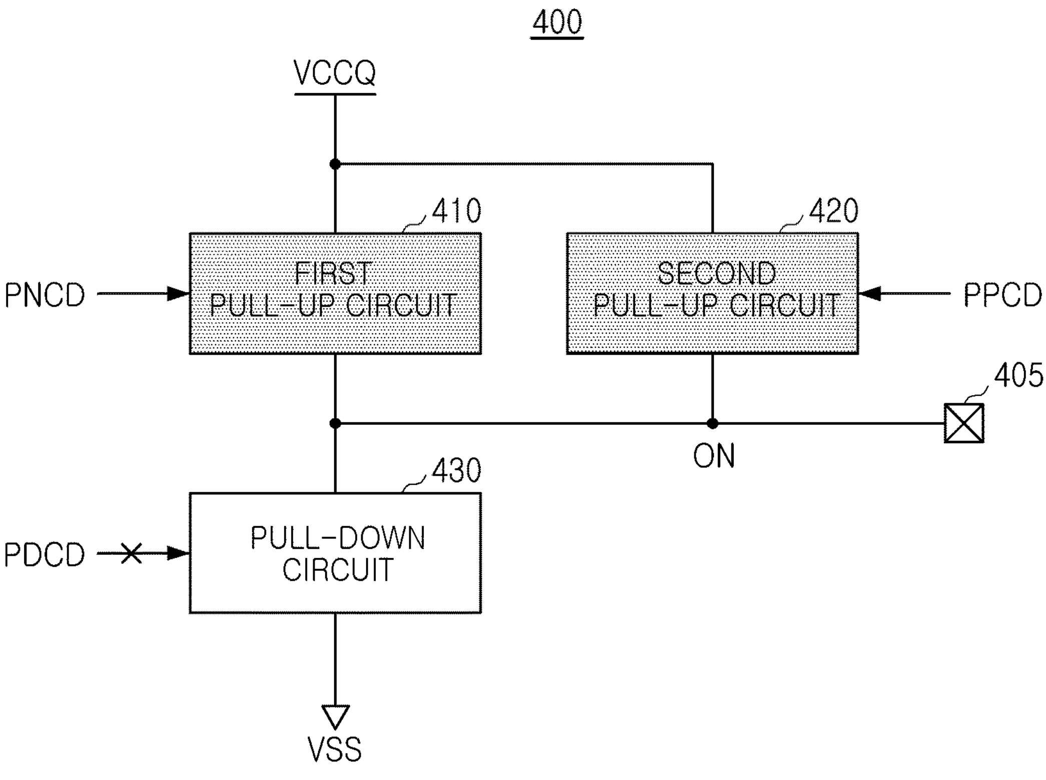
FIGS. 8 and 9 are views illustrating an operation of a semiconductor device according to embodiments.
Figure 9:
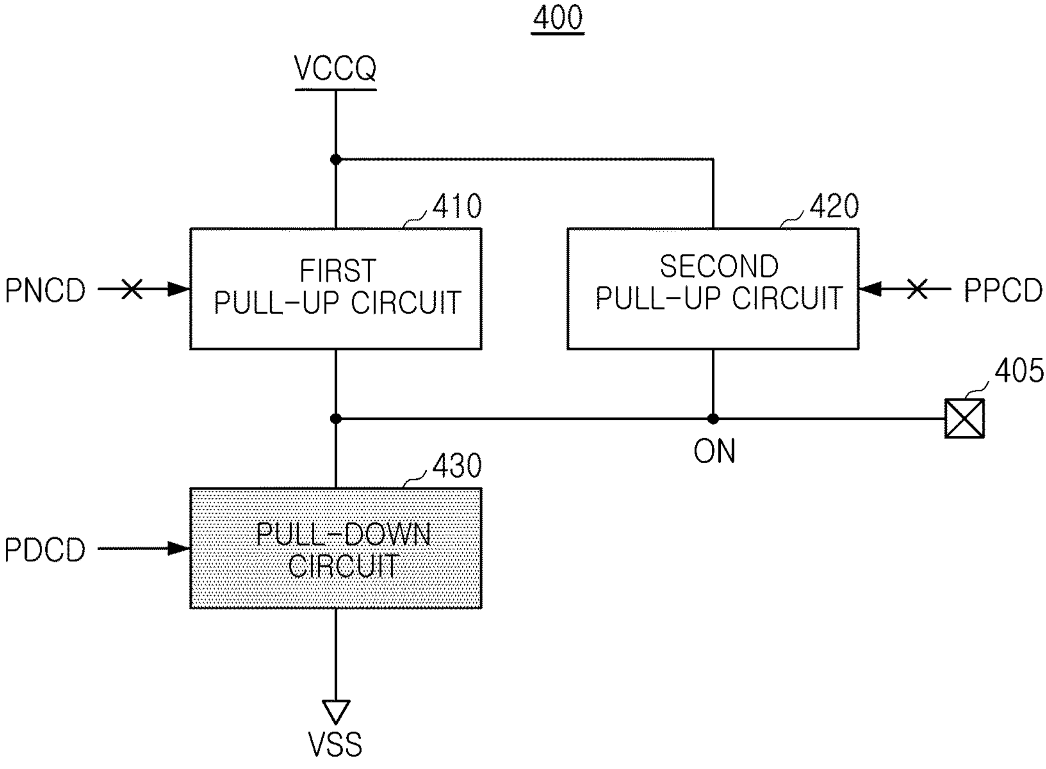

FIGS. 8 and 9 are views illustrating an operation of a semiconductor device according to embodiments. Referring to FIGS. 8 and 9, a semiconductor device 400 according to an embodiment may include a first pull-up circuit 410, a second pull-up circuit 420, a pull-down circuit 430, or the like, connected to an output pad 405. The first pull-up circuit 410, the second pull-up circuit 420, and the pull-down circuit 430 may be commonly connected to an output node ON, respectively, and may output a signal to the output node ON and the output pad 405. The output pad 405 may be connected to an external semiconductor device, and a swing range and a swing level of the signal may be changed depending on a termination method, as described above.

In an embodiment illustrated in FIGS. 8 and 9, the output pad 405 may be terminated in an LTT scheme. FIG. 8 is a view illustrating an operation of the semiconductor device 400 while a signal output to the output pad 405 has a high level. Referring to FIG. 8, a first pull-up code PNCD may be input to the first pull-up circuit 410, and a second pull-up code PPCD may be input to the second pull-up circuit 420.

The first pull-up code PNCD and the second pull-up code PPCD may be data having a plurality of bits, respectively, and the number of bits of the first pull-up code PNCD may be equal to or different from the number of bits of the second pull-up code PPCD. As described above with reference to FIGS. 3 and 4, on-resistance of the first pull-up circuit 410 and on-resistance of the second pull-up circuit 420 may be changed by the first pull-up code PNCD and the second pull-up code PPCD.

The on-resistance of the first pull-up circuit 410 may be determined in the ZQ calibration operation, and the first pull-up code PNCD may determine on/off of a plurality of NMOS transistors included in the first pull-up circuit 410 such that the first pull-up circuit 410 has the determined on-resistance in the ZQ calibration operation. On the other hand, the on-resistance of the second pull-up circuit 420 may be adaptively determined.

When the output pad 405 is terminated in the LTT scheme, the on-resistance of the first pull-up circuit 410 may be set to a relatively greater value than termination resistance connected to the output pad 405. Therefore, a rising period in which a level of a signal output to the output pad 405 increases by activating the first pull-up circuit 410 may increase, and a duty ratio of the signal may decrease, such that SI characteristic of the signal may deteriorate.

In an embodiment, as illustrated in FIG. 8, the above problem may be solved by connecting the second pull-up circuit 420 to the first pull-up circuit 410 in parallel. For example, the second pull-up circuit 420 may be activated to have lower on-resistance than on-resistance of the first pull-up circuit 410, to decrease a total resistance value of the first pull-up circuit 410 and the second pull-up circuit 420 and to rapidly increase the signal in the rising period.

As illustrated in FIG. 8, a pull-down code PDCD may not be input to the pull-down circuit 430 in a rising period and a period in which a signal has a high level.

For example, the first pull-up circuit 410 may be activated in response to an activated code (e.g., '1') of the first pull-up code PNCD, the second pull-up circuit 420 may be activated in response to an activated code (e.g., '0') of the second pull-up code PUCD, and the pull-down circuit 430 may be inactivated in response to an inactivated code (e.g., '0') of the pull-down code PDCD. Therefore, a level of a signal output to the output pad 405 may increase to VCCQ*⅔, which may be a high level.

In a falling period in which a signal decreases from a high level to a low level and in a period in which the signal has a low level, the semiconductor device 400 may operate as illustrated in FIG. 9. Referring to FIG. 9, the first pull-up code PNCD and the second pull-up code PPCD may not be input to the first pull-up circuit 410 and the second pull-up circuit 420, and the pull-down code PDCD may be input to the pull-down circuit 430.

For example, the first pull-up circuit 410 may be inactivated in response to an inactivated code (e.g., '0') of the first pull-up code PNCD, the second pull-up circuit 420 may be inactivated in response to an inactivated code (e.g., '1') of the second pull-up code PUCD, and the pull-down circuit 430 may be activated in response to an activated code (e.g., '1') of the pull-down code PDCD. Therefore, a level of a signal output to the output pad 405 may decrease to a second power voltage VSS, which may be a low level.

Figure 10:
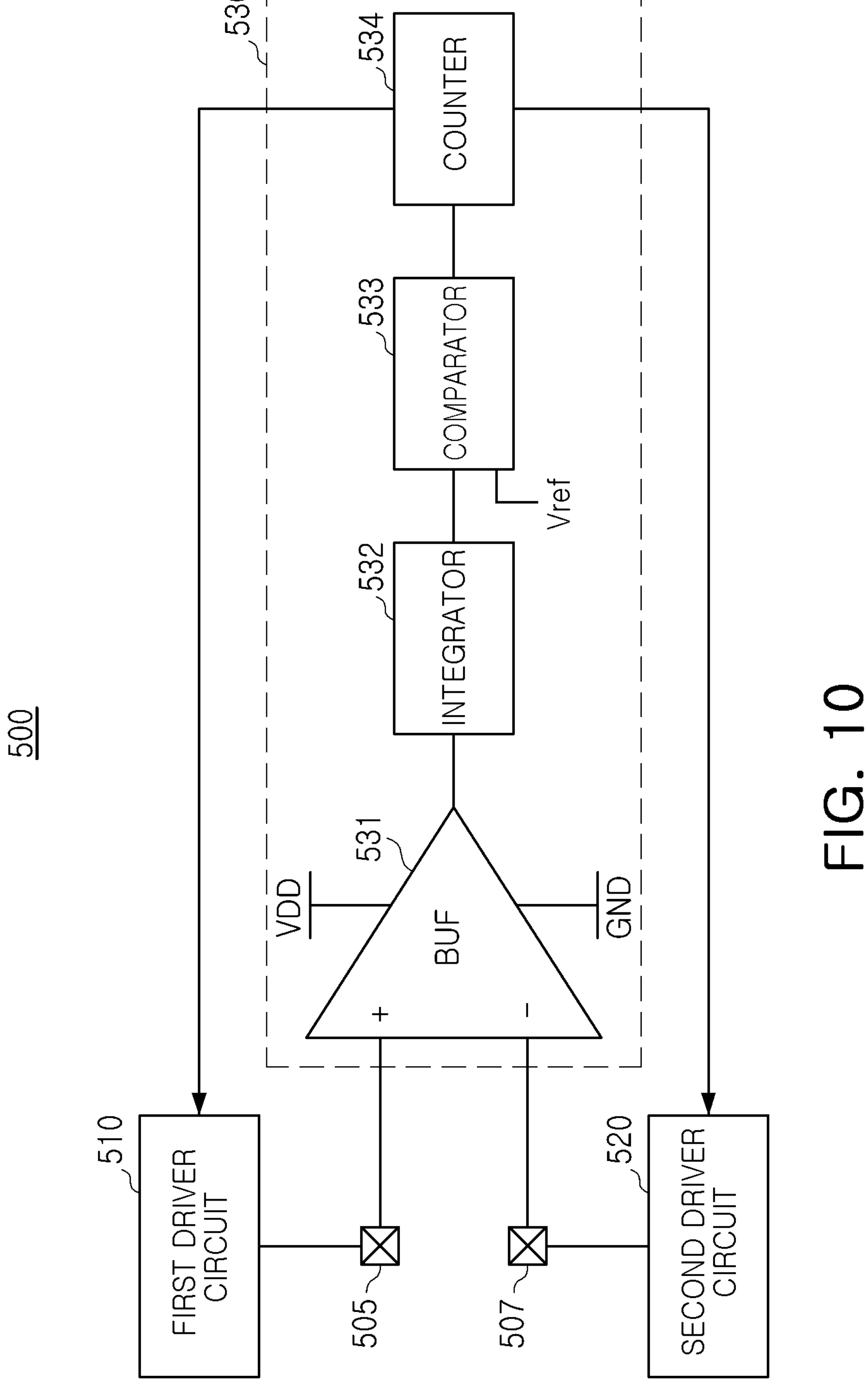
FIGS. 10, 11A, and 11B are views schematically illustrating a semiconductor device according to an embodiment.
Figure 11A:
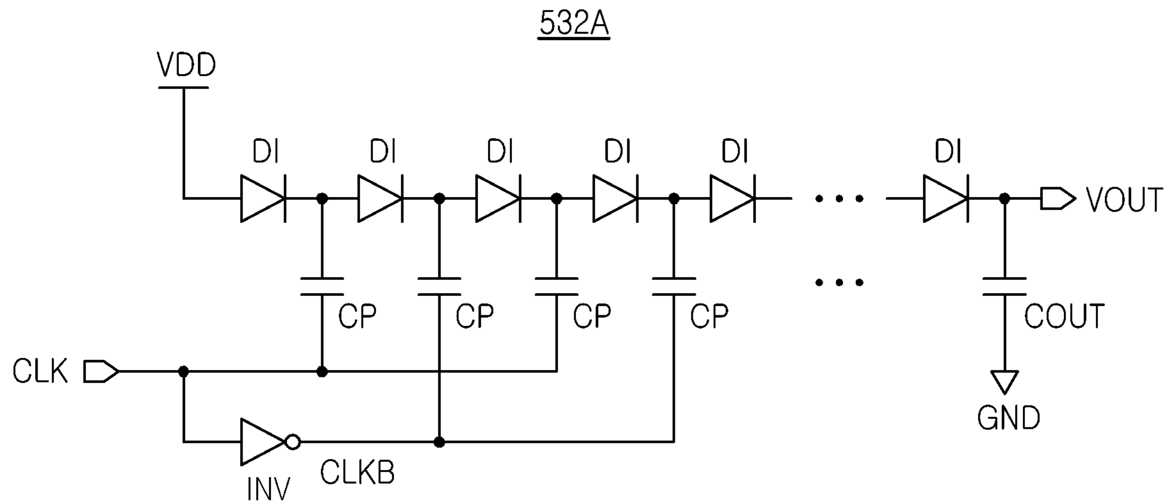
Figure 11B:
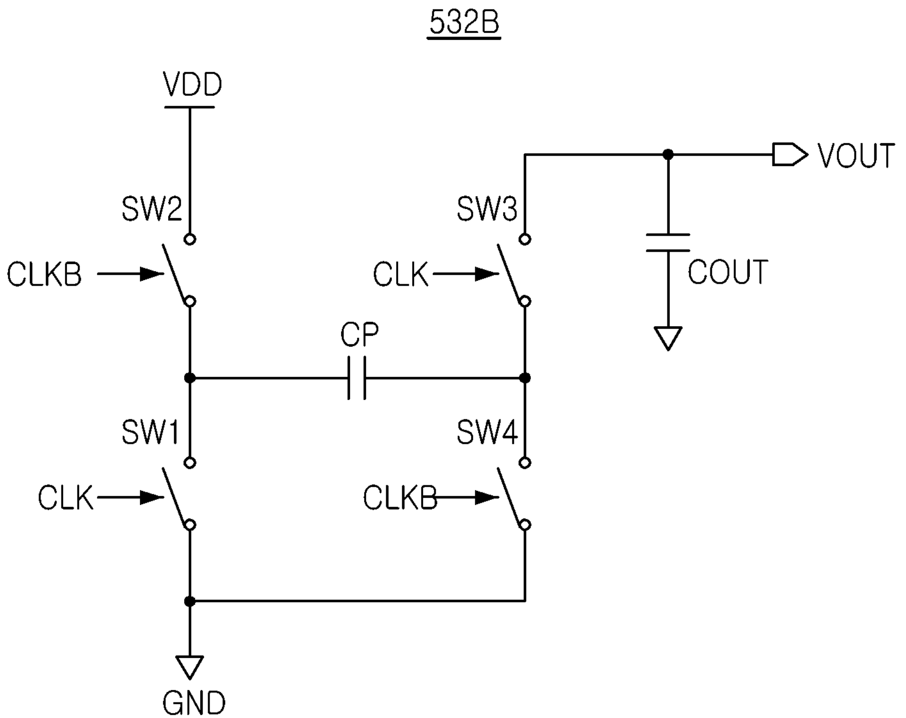

FIGS. 10, 11A, and 11B are views schematically illustrating a semiconductor device according to an embodiment.

Referring to FIG. 10, a semiconductor device 500 according to an embodiment may include a first driver circuit 510 connected to a first output pad 505, a second driver circuit 520 connected to a second output pad 507, an output control circuit 530, and the like. A structure of the first driver circuit 510 and a structure of the second driver circuit 520 may be similar to those previously described with reference to FIGS. 8 and 9. For example, the first driver circuit 510 and the second driver circuit 520 may include a first pull-up circuit, a second pull-up circuit, and a pull-down circuit, respectively.

The output control circuit 530 may control an operation of the first driver circuit 510 and an operation of the second driver circuit 520. For example, the output control circuit 530 may output a second pull-up code to each of the first driver circuit 510 and the second driver circuit 520, to output a first signal to the first output pad 505 and output a second signal to the second output pad 507. In an embodiment, a phase difference between the first signal and the second signal may be 180 degrees.

When the first output pad 505 and the second output pad 507 may be terminated by an LTT scheme, respectively, a rising period of the first signal and a rising period of the second signal may increase, causing deterioration in that a duty ratio decreases below 50%. In an embodiment, to improve this deterioration, the second pull-up circuit of each of the first and second driver circuits 510 and 520 may be used as described above with reference to FIGS. 8 and 9.

For example, when the duty ratio of the first signal is less than 50%, the output control circuit 530 may output a second pull-up code activating the second pull-up circuit to the first driver circuit 510. Similarly, when the duty ratio of the second signal is less than 50%, the output control circuit 530 may output a second pull-up code activating the second pull-up circuit to the second driver circuit 520. The first driver circuit 510 and the second driver circuit 520 may be independently controlled.

In an embodiment, the output control circuit 530 may be included in the control circuit 130 of FIG. 2. For example, in a first operating mode (e.g., LTT termination mode), the control circuit 130 may output a first pull-up code to the first pull-up circuit and a pull-down code to the pull-down circuit when performing a ZQ calibration operation. In this case, the output control circuit 530 may output a second pull-up code to the second pull-up circuit to adjust a duty ratio of each of the first and second signals after performing the ZQ calibration operation.

Referring to FIG. 10, the output control circuit 530 may include a buffer 531, an integrator 532, a comparator 533, a counter 534, and the like. The buffer 531 may be a fully differential amplifier receiving the first signal and the second signal, and a buffer output signal output by the buffer 531 may be a digital signal swinging between a ground voltage GND and a power voltage VDD. Herein, for convenience of description, the terms of the power voltage VDD and a power voltage VCC may be used interchangeably.

The integrator 532 may operate in response to the digital signal output from the buffer 531. In an embodiment, the integrator 532 may include a charge pump circuit, and in this case, switch devices included in the charge pump circuit may be turned on and off by the digital signal. When the integrator 532 includes the charge pump circuit, a level of an output voltage of the integrator 532 may increase as a duty ratio of the digital signal output from the buffer 531 increases.

The comparator 533 may compare the output voltage of the integrator 532 and a predetermined reference voltage Vref. In an embodiment, a level of the reference voltage may be ½ times a level of the power voltage VDD supplied to a circuit region in which the output control circuit 530 is implemented. The counter 534 may output an N-bit code (N is a natural number greater than or equal to 2) based on a comparison result of the comparator 533. For example, the N-bit code output from the counter 534 may be the second pull-up code input to the second pull-up circuit of each of the first driver circuit 510 and the second driver circuit 520. For example, the second pull-up code may be adjusted by the counter 534.

FIGS. 11A and 11B are circuit diagrams illustrating a charge pump circuit that may be included in an integrator 532 as an example. Referring first to FIG. 11A, a charge pump circuit 532A according to an embodiment may include a plurality of diodes DI, a plurality of pumping capacitors CP, an output capacitor COUT, and the like. The plurality of diodes DI may be connected in series, and the plurality of pumping capacitors CP may be connected to a node between the plurality of diodes DI. A first diode of the plurality of diodes DI may receive a power voltage VDD having a predetermined level, and the last diode of the plurality of diodes DI may output a voltage VOUT.

Each of the plurality of pumping capacitors CP may be charged or discharged by a clock signal CLK or a complementary clock signal CLKB which may be phase-converted to have an opposite phase to the clock signal CLK by an inverter INV. For example, in the embodiment illustrated in FIG. 11A, odd-numbered pumping capacitors CP may be charged or discharged by the clock signal CLK, and evennumbered pumping capacitors CP may be charged or discharged by the complementary clock signal CLKB.

Alternately, referring to FIG. 11B, a charge pump circuit 532B according to an embodiment may include a plurality of switch devices SW1 to SW4, at least one pumping capacitor CP, at least one an output capacitor COUT, and the like. Among the plurality of switch devices SW1 to SW4, a second switch device SW2 may receive a power voltage VDD, and a first switch device SW1 and a fourth switch device SW4 may receive a ground voltage GND. A third switch device SW3 may be connected between an output node and the pumping capacitor CP.

The first switch device SW1 and the third switch device SW3 may be turned on/off by a clock signal CLK, and the second switch device SW2 and the fourth switch device SW4 may be turned on/off by a complementary clock signal CLKB. When the second switch device SW2 and the fourth switch device SW4 are turned on, a charge may be charged in the pumping capacitor CP by a power voltage VDD. When the first switch device SW1 and the third switch device SW3 are turned on, an output voltage VOUT may be output while the charge stored in the pumping capacitor CP is shared with the output capacitor COUT.

For convenience of explanation, it is assumed that the first output pad 505 is connected to a non-inverting input terminal of the buffer 531, and the second output pad 507 is connected to an inverting input terminal of the buffer 531. In this case, a level of a digital signal output from the buffer 531 may be set to the power voltage VDD for a time period when a first signal applying to the non-inverting input terminal is greater than a second signal applying to the inverting input terminal, and may be set to the ground voltage GND for a time period when the first signal is less than the second signal.

In the embodiment illustrated in FIG. 11B, the digital signal output from the buffer 531 may be input to the charge pump circuit 532B as the complementary clock signal CLKB. Therefore, the output voltage VOUT of the charge pump circuit 532B may increase, as a time period when a level of the digital signal has the power voltage VDD, e.g., a time period when the first signal is greater than the second signal may be longer.

When the first output pad 505 is terminated in an LTT scheme, pull-up resistance set in the first driver circuit 510 may inevitably increase, and as a result, a rising period of the first signal may be lengthened. When the rising period of the first signal is lengthened, a time period in which the first signal is smaller than the second signal may increase, to decrease a duty ratio of the digital signal output from the buffer 531, and decrease below VDD/2, which may be a reference voltage to which the output voltage VOUT of the charge pump circuit 532B is input to a comparator.

When the output voltage VOUT decreases below the reference voltage input to the comparator, the counter 534 may adjust a second pull-up code input to a second pull-up circuit of the first driver circuit 510. For example, the counter 534 may adjust the second pull-up code such that resistance of the second pull-up circuit decreases in response to a decrease in the output voltage VOUT to be less than the reference voltage. When the resistance of the second pull-up circuit decreases due to the second pull-up code adjusted by the counter 534, total pull-up resistance of the first driver circuit 510 may decrease, such that the rising period of the first signal may be shorten, and the duty ratio of the digital signal output from the buffer 531 may increase. Therefore, the output voltage VOUT of the charge pump circuit 532B may increase.

The resistance of the second pull-up circuit may be reduced by the second pull-up code adjusted by the counter 534, such that the rising period of the first signal is too short and the duty ratio of the first signal exceeds 50%. In this case, the duty ratio of the digital signal output from the buffer 531 may also be greater than 50%. Therefore, the output voltage VOUT of the charge pump circuit 532B may increase to more than the reference voltage input to the comparator.

The counter 534 may adjust the second pull-up code such that resistance of the second pull-up circuit increases in response to an increase in the output voltage VOUT greater than the reference voltage. When the resistance of the second pull-up circuit increases due to the second pull-up code adjusted by the counter 534, the total pull-up resistance of the first driver circuit 510 may increase such that the rising period of the first signal may be longer. As such, in an embodiment, the output control circuit 530 may adaptively adjust the second pull-up code input to the first driver circuit 510, to set the duty ratio of the first signal to have a value of 50% or a value close to 50%.

The output control circuit 530 may also adjust the second pull-up code input to the second driver circuit 520 in a similar manner. Therefore, the duty ratio of the second signal may also be set to have a value of 50% or a value close to 50%.

Figure 12:
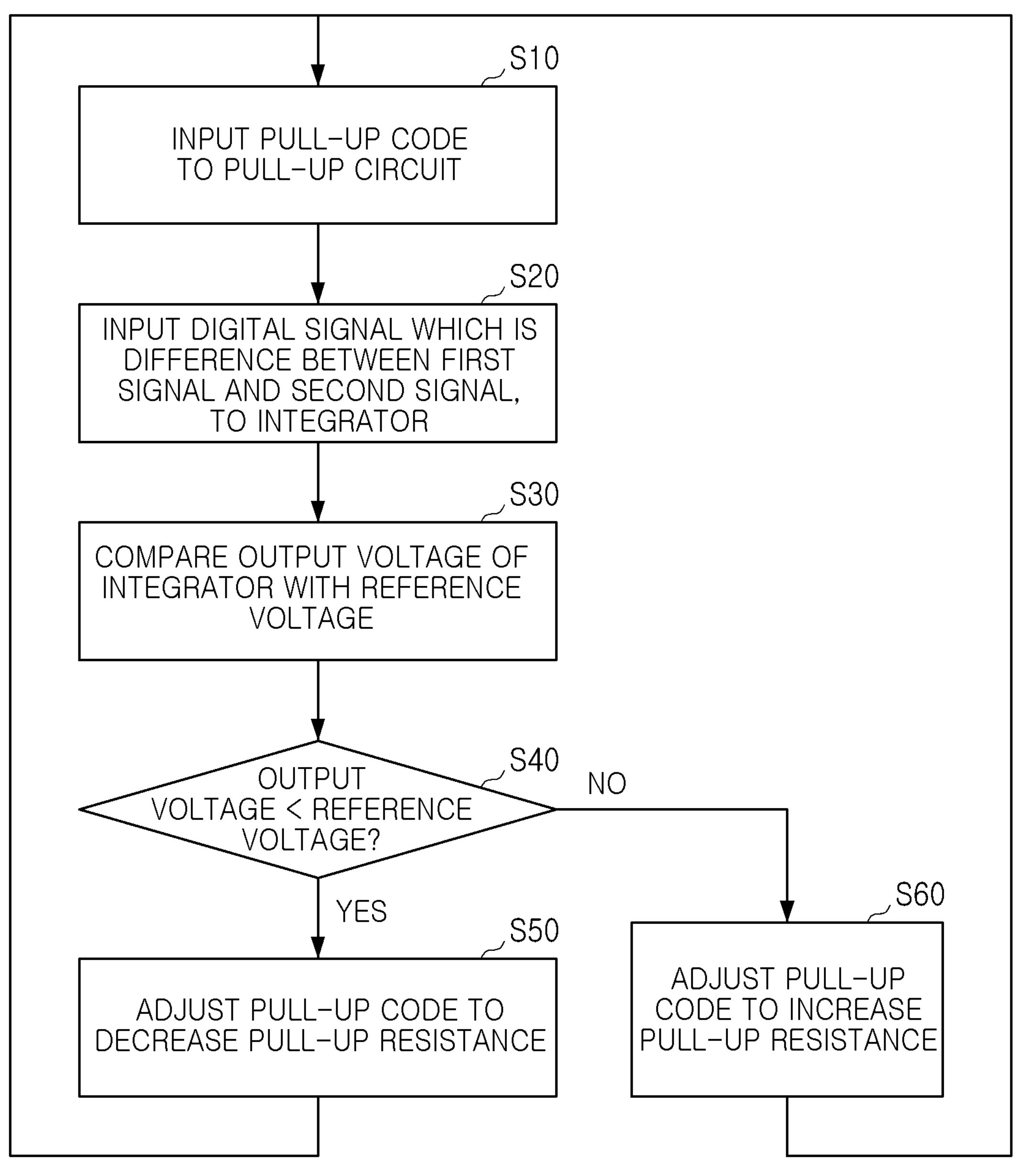
FIG. 12 is a flowchart illustrating an operation of a semiconductor device according to embodiments.

FIG. 12 is a flowchart illustrating an operation of a semiconductor device according to embodiments.

Referring to FIG. 12, an operation of a semiconductor device according to an embodiment may start when a control circuit inputs a pull-up code to a pull-up circuit (S10). The pull-up circuit may include a first pull-up circuit and a second pull-up circuit, connected to each other in parallel, the first pull-up circuit may include NMOS transistors and the second pull-up circuit may include PMOS transistors. The control circuit may input a first pull-up code determined by a ZQ calibration operation to the first pull-up circuit.

For example, the control circuit may input a pull-up code to a pull-up circuit of a first driver circuit outputting a first signal to a first output pad, and may input a pull-up code to a pull-up circuit of a second driver circuit outputting a second signal to a second output pad. The pull-up code input to the pull-up circuit of the first driver circuit and the pull-up code input to the pull-up circuit of the second driver circuit may be individually determined in the ZQ calibration operation, and therefore may be the same or different.

The first signal and the second signal may be complementary to each other. The first signal and the second signal may be input to a fully differential amplifier included in the control circuit. The fully differential amplifier may output a digital signal corresponding to a difference between the first signal and the second signal, and the digital signal may be input to an integrator (S20). As described above with reference to FIGS. 10, 11A and 11B, the integrator may be implemented as a charge pump circuit.

A comparator of the control circuit may compare an output voltage of the integrator with a reference voltage (S30). For example, the reference voltage may be equal to a middle voltage of a swing range of the digital signal input to the integrator. For example, the digital signal may have a high level when the first signal is greater than the second signal, and may have a low level when the first signal is less than the second signal. Therefore, a duty ratio of the digital signal may be determined according to characteristics of the first signal and characteristics of the second signal. For example, as the first signal slowly increases in a rising period, the duty ratio of the digital signal may decrease.

The integrator implemented as the charge pump circuit may perform a charging operation when the digital signal has the high level, and a discharging operation when the digital signal has the low level. In this case, the output voltage of the integrator may increase, as the duty ratio of the digital signal increases. Therefore, as the first signal increases slowly in the rising period, e.g., as the duty ratio of the first signal decreases, the output voltage of the integrator may be lower than the reference voltage.

When the output voltage is lower than the reference voltage (S40, YES)), the control circuit may adjust the pull-up code such that the first signal increases faster in the rising period. For example, the control circuit may adjust a second pull-up code input to a second pull-up circuit of the first driver circuit, to decrease pull-up resistance of the pull-up circuit included in the first driver circuit (S50). When the output voltage is higher than the reference voltage (S40, NO), the control circuit may adjust the pull-up code to increase the pull-up resistance of the pull-up circuit included in the first driver circuit (S60).

When the output voltage is lower than the reference voltage as a result of initially performing determination of S40, the control circuit may input the second pull-up code to the second pull-up circuit to reduce the pull-up resistance of the first driver circuit. When the pull-up resistance of the first driver circuit is excessively reduced, the duty ratio of the first signal may be greater than 50%. In this case, it may be determined that the output voltage is higher than the reference voltage in S40, and the control circuit may adjust the second pull-up code again to increase the pull-up resistance of the first driver circuit. As such, the control circuit may adjusting the second pull-up code input to the second pull-up circuit to set the duty ratio of the first signal output from the first driver circuit to have a value of 50% or a value close to 50%.

FIGS. 13 to 17 are views illustrating an operation of a semiconductor device according to embodiments.

Figure 13:
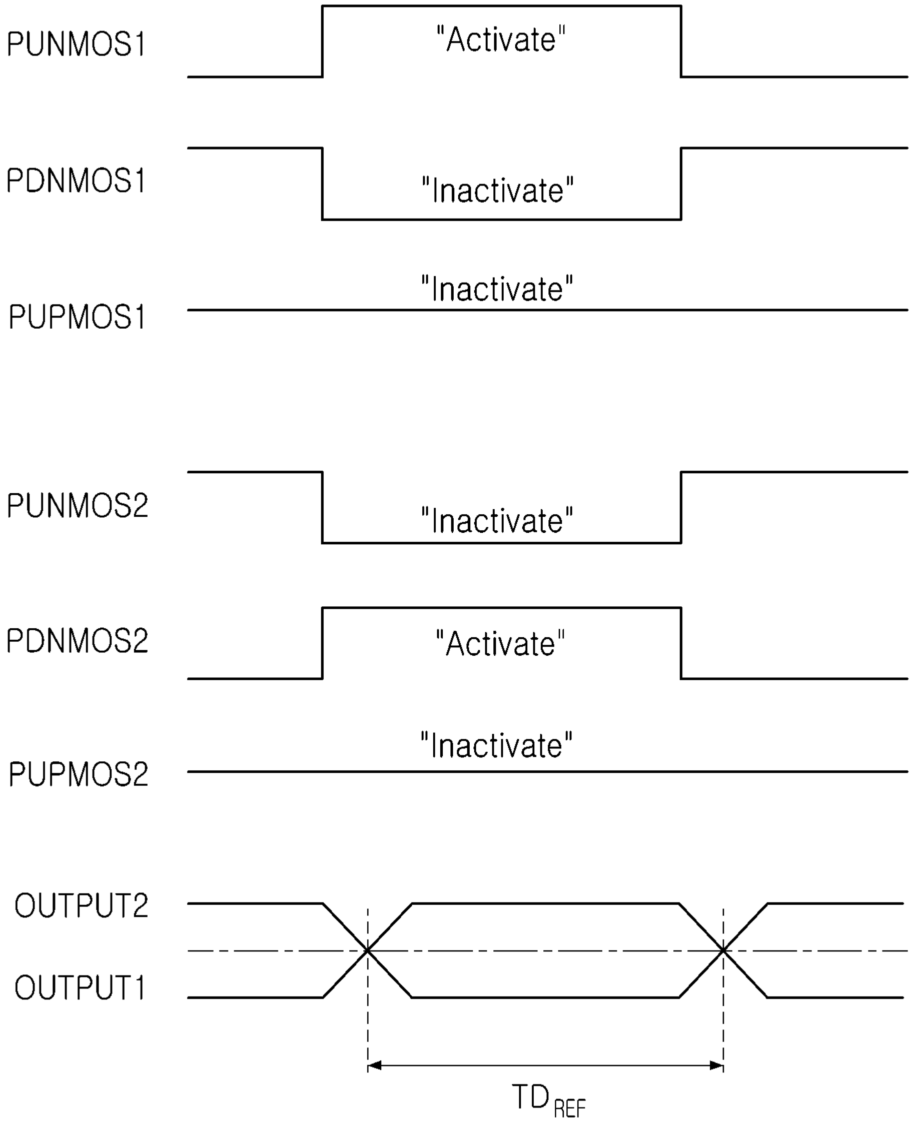
FIGS. 13 to 17 are views illustrating an operation of a semiconductor device according to embodiments.

FIG. 13 is a timing diagram illustrating an operation of a semiconductor device according to an embodiment, and FIGS. 14 to 17 are views illustrating an operation of a semiconductor device at a plurality of time points defined in a timing diagram. In an embodiment described with reference to FIGS. 13 to 17, a semiconductor device may include a first driver circuit 610 outputting a first signal OUTPUT1 to a first output pad 605, and a second driver circuit 620 outputting a second signal OUTPUT2 to a second output pad 607.

Figure 14:
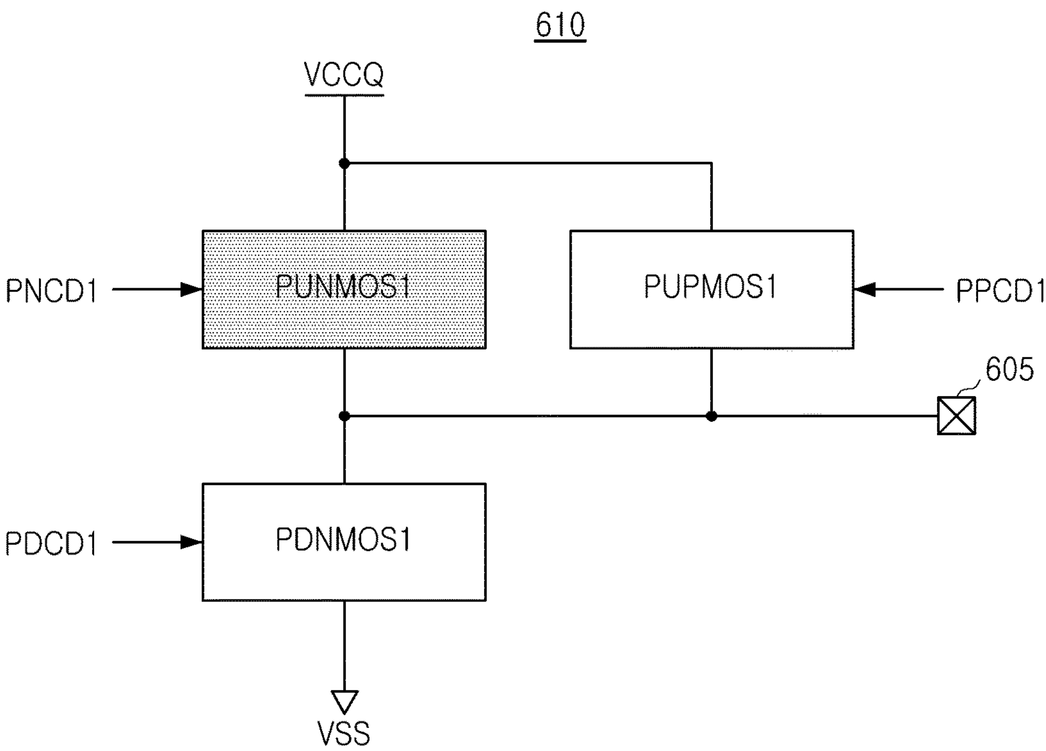
Figure 16:
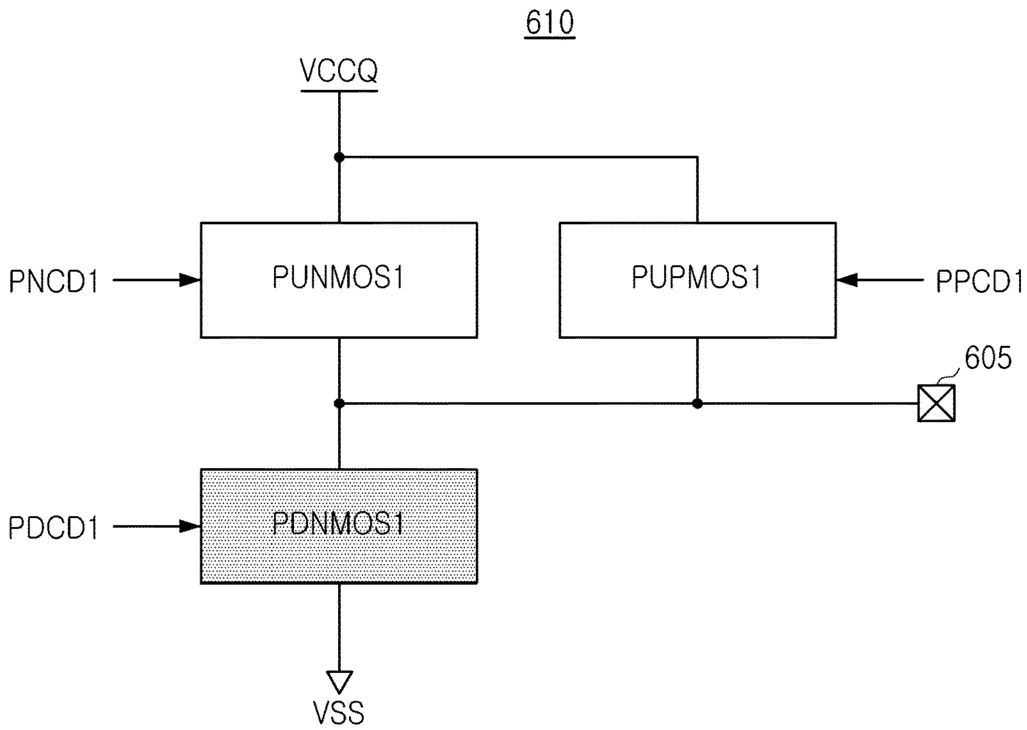

Referring to FIGS. 14 and 16, the first driver circuit 610 may include a first pull-up circuit PUNMOS1, a second pull-up circuit PUPMOS1, and a pull-down circuit PDNMOS1. The first pull-up circuit PUNMOS1 may operate by receiving a first pull-up code PNCD1 from a control circuit, the second pull-up circuit PUPMOS1 may operate by receiving a second pull-up code PPCD1 from the control circuit, and the pull-down circuit PDNMOS1 may operate by receiving a pull-down code PDCD1 from the control circuit.

Figure 15:
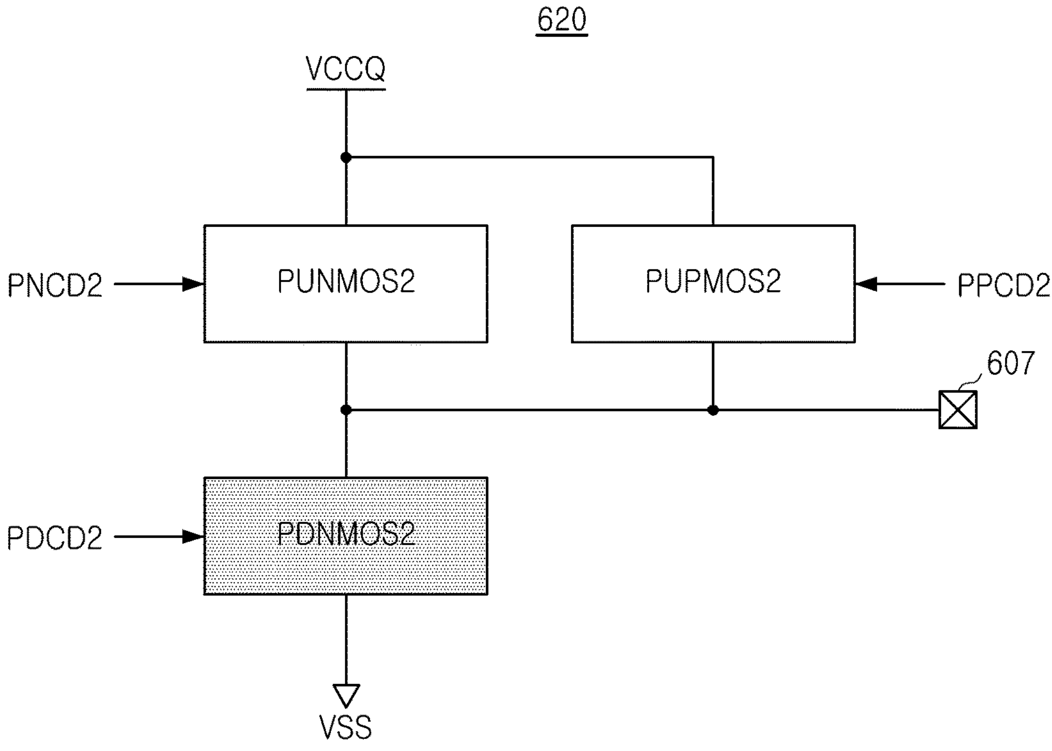
Figure 17:
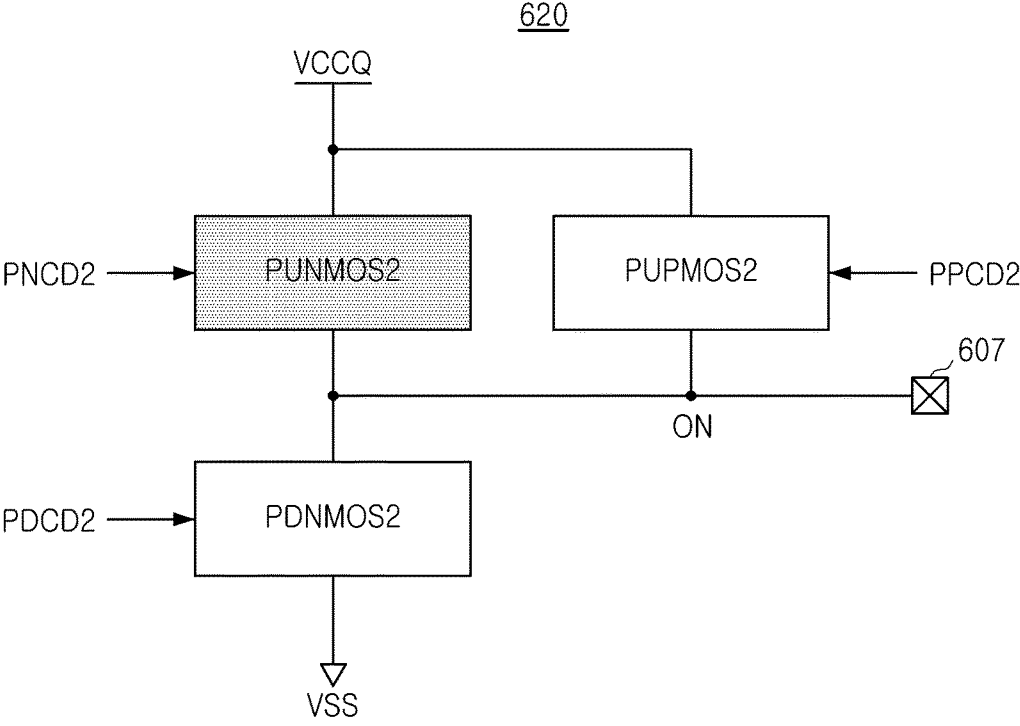

Similarly, referring to FIGS. 15 and 17, the second driver circuit 620 may include a first pull-up circuit PUNMOS2, a second pull-up circuit PUPMOS2, and a pull-down circuit PDNMOS2. The first pull-up circuit PUNMOS2 may operate by receiving a first pull-up code PNCD2 from the control circuit, the second pull-up circuit PUPMOS2 may operate by receiving a second pull-up code PPCD2 from the control circuit, and the pull-down circuit PDNMOS2 may operate by receiving a pull-down code PDCD2 from the control circuit.

An operation method of the first driver circuit 610 may be similar to an operation method of the second driver circuit 620. For example, in the first driver circuit 610, when at least one of the first pull-up circuit PUNMOS1 and the second pull-up circuit PUPMOS1 is activated, the first signal OUTPUT1 may increase to a high level corresponding to a first power voltage VCCQ. When the pull-down circuit PDNMOS1 may be activated, the first signal OUTPUT1 may decrease to a low level corresponding to a second power voltage VSS.

Referring to FIG. 13, a rising period in which the first signal OUTPUT1 increases from a low level to a high level may overlap a falling period in which the second signal OUTPUT2 decreases from a high level to a low level. Therefore, the first signal OUTPUT1 and the second signal OUTPUT2 may cross each other in the rising period of the first signal OUTPUT1.

Referring to FIG. 13, a voltage level when the first signal OUTPUT1 and the second signal OUTPUT2 cross each other may correspond to half of a difference between the first power voltage VCCQ corresponding to the high level and the second power voltage VSS corresponding to the low level. When the second power voltage VSS is on a ground level, the voltage level at which the first signal OUTPUT1 and the second signal OUTPUT2 cross each other may be substantially equal to ½ times of the first power voltage VCCQ, in the embodiment illustrated in FIG. 13. Therefore, a time period $TD_{REF}$ in which the first signal OUTPUT1 has a higher level than the second signal OUTPUT2 may be determined to be ½ times one period of the first signal OUTPUT1. Therefore, the embodiment illustrated in FIG. 13 may correspond to a case in which SI characteristics of the first signal OUTPUT1 and SI characteristics of the second signal OUTPUT2 are excellent, and as illustrated in FIG. 13, the second pull-up circuits PUPMOS1 and PUPMOS2 may not operate.

FIGS. 14 and 15 are views illustrating an operation of the first driver circuit 610 and an operation of the second driver circuit 620 in a rising period of the first signal OUTPUT1. Referring to FIGS. 14 and 15, during the rising period of the first signal OUTPUT1, only a first pull-up circuit PUNMOS1 may be activated in the first driver circuit 610, and a pull-down circuit PDNMOS2 may be activated in the second driver circuit 620 may be activated. Referring to FIGS. 16 and 17 illustrating the operation during the rising period of the second signal OUTPUT2, a pull-down circuit PDNMOS1 may be activated in the first driver circuit 610, and a first pull-up circuit PUNMOS2 may be activated in the second driver circuit 620. For example, in each of the first driver circuit 610 and the second driver circuit 620, second pull-up circuits PUPMOS1 and PUPMOS2 may not operate.

FIGS. 18 to 22 are views illustrating an operation of a semiconductor device according to embodiments.

Figure 18:
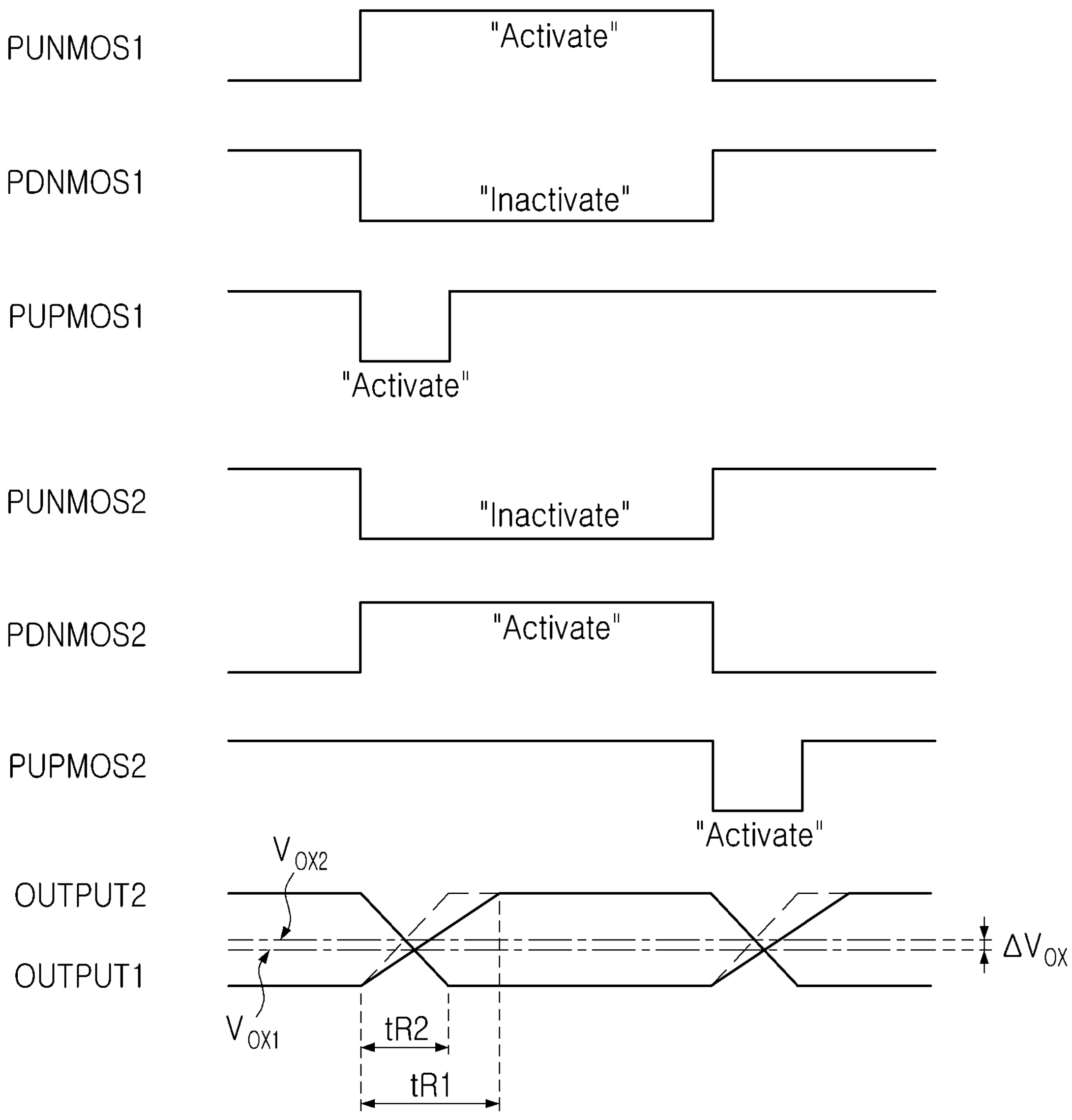
FIGS. 18 to 22 are views illustrating an operation of a semiconductor device according to embodiments.

FIG. 18 is a timing diagram illustrating an operation of a semiconductor device according to an embodiment, and FIGS. 19 to 22 are views illustrating an operation of a semiconductor device at a plurality of time points defined in a timing diagram.

Unlike the embodiment described above with reference to FIGS. 13 to 17, in the embodiment described with reference to FIGS. 18 to 22, a first signal OUTPUT1 and a second signal OUTPUT2 may relatively slowly increase in a rising period, respectively. Referring to FIG. 18, the first signal OUTPUT1 may increase from a low level to a high level during a first rising period tR1. In a semiconductor device according to an embodiment, the first signal OUTPUT1 may be generated by activating second pull-up circuits PUP- MOS1 and PUPMOS2 in a first driver circuit 610 and a second driver circuit 620, respectively. The first rising period tR1 required for each of the first signal OUTPUT1 and the second signal OUTPUT2 to increase from a low level to a high level may be shortened to a second rising period tR2.

Referring to FIG. 18, as a rate at which each of the first signal OUTPUT1 and the second signal OUTPUT2 increases from the low level to the high level slows down, a voltage level in which the first signal OUTPUT1 and the second signal OUTPUT2 cross each other may decrease to a first crossover voltage $V_{OX1}$. The first crossover voltage $V_{OX1}$ may be a voltage smaller than a second crossover voltage $V_{OX2}$ by a predetermined voltage difference $\Delta V_{OX}$. In the embodiment illustrated in FIG. 18, the second crossover voltage $V_{OX2}$ may be a voltage level on which the first signal OUTPUT1 and the second signal OUTPUT2 cross each other. For example, the second crossover voltage $V_{OX2}$ may correspond to ½ times the first power voltage VCCQ.

A configuration of a control circuit that controls each of the first driver circuit 610 and the second driver circuit 620 may be similar to that described above with reference to FIG. 10. In the embodiment illustrated in FIG. 18, the control circuit may activate the second pull-up circuits PUPMOS1 and PUPMOS2 in the first driver circuit 610 and the second driver circuit 620, respectively, in response to a decrease in a crossover voltage between the first signal OUTPUT1 and the second signal OUTPUT2 to the first crossover voltage $V_{OX1}$.

In an embodiment, a time period in which second pull-up circuits PUPMOS1 and PUPMOS2 are activated, respectively, may be shorter than a time period in which first pull-up circuits PUNMOS1 and PUNMOS2 are activated, respectively. Referring to FIG. 18, a time period in which the control circuit inputs a second pull-up code PPCD1 to the second pull-up circuit PUPMOS1 of the first driver circuit 610 may overlap a time period in which the first signal OUTPUT1 increases from a low level to a high level. Similarly, a time period in which the control circuit inputs a second pull-up code PPCD2 to the second pull-up circuit PUPMOS2 of the second driver circuit 620 may overlap a time period in which the second signal OUTPUT2 increases from a low level to a high level.

Figure 19:
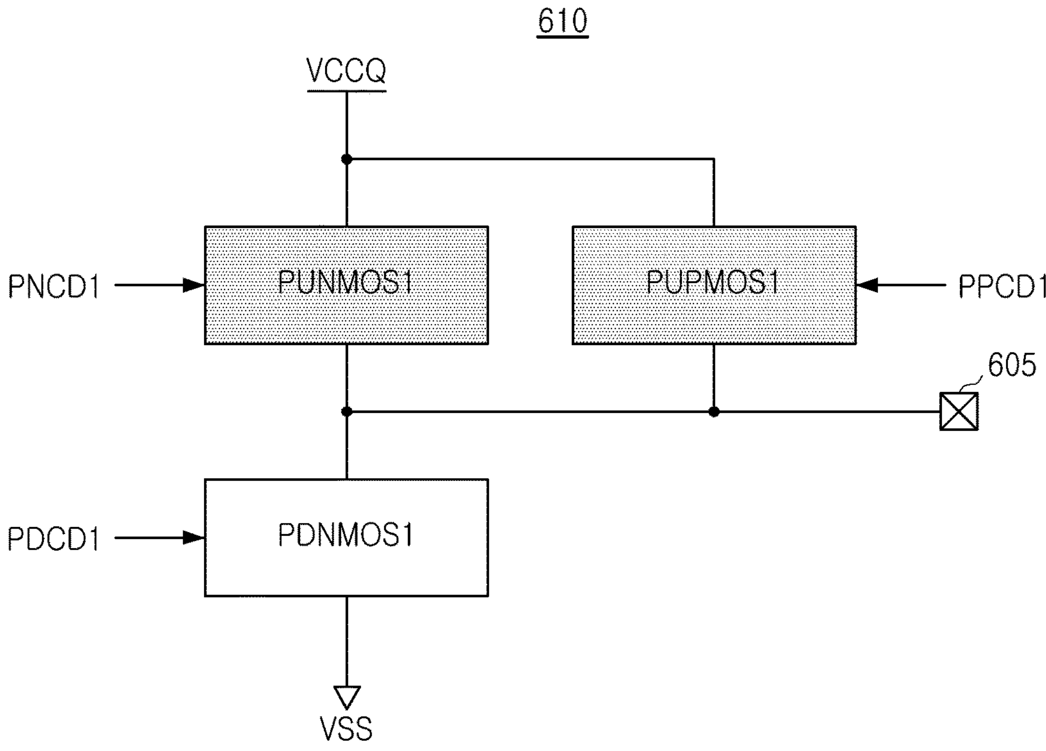
Figure 20:
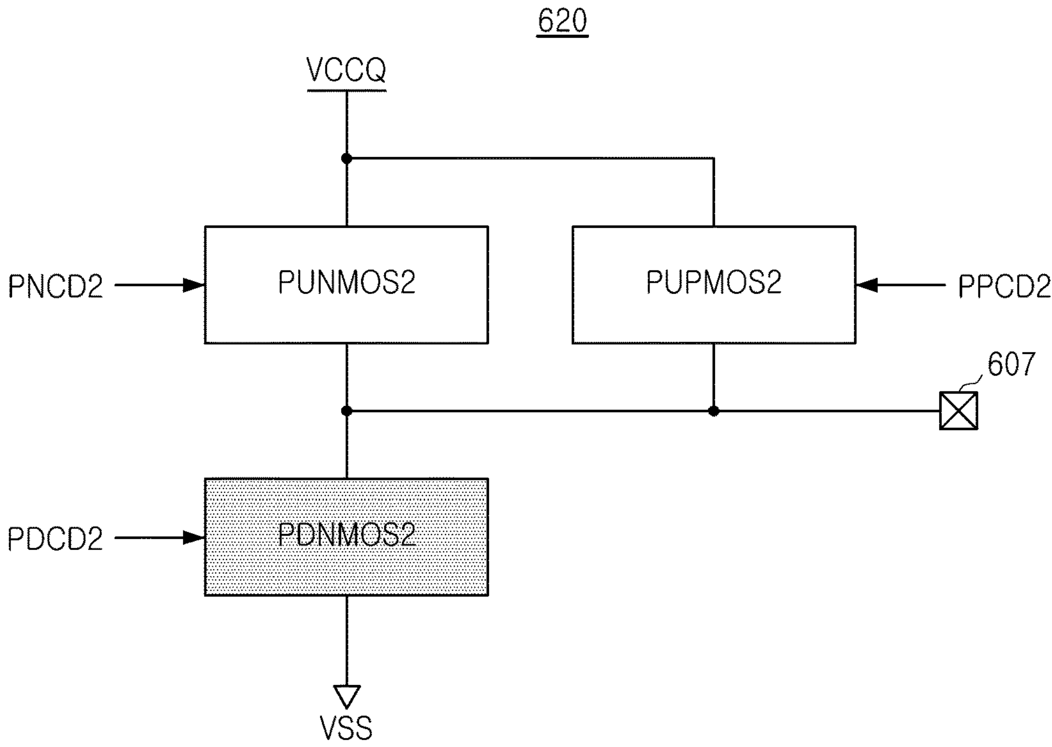

FIGS. 19 and 20 are views illustrating an operation of the first driver circuit 610 and an operation of the second driver circuit 620 in a rising period of the first signal OUTPUT1. Referring to FIGS. 19 and 20, during the rising period of the first signal OUTPUT1, a first pull-up circuit PUNMOS1 and a second pull-up circuit PUPMOS1 may operate in the first driver circuit 610, and a pull-down circuit PDNMOS2 may operate in the second driver circuit 620. As both the first pull-up circuit PUNMOS1 and the second pull-up circuit PUPMOS1 operate, pull-up resistance of the first driver circuit 610 may decrease. Therefore, the first signal OUTPUT1 may increase relatively faster, and a first rising period tR1 of the first signal OUTPUT1 may decrease to a second rising period tR2.

Figure 21:
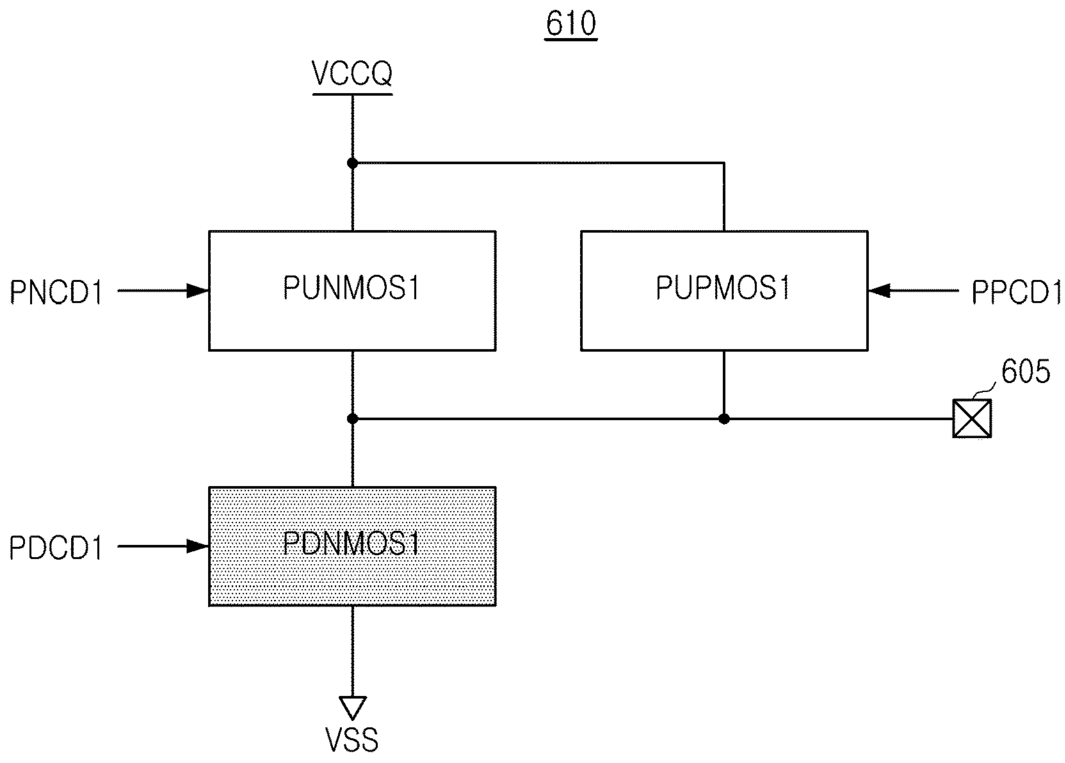
Figure 22:
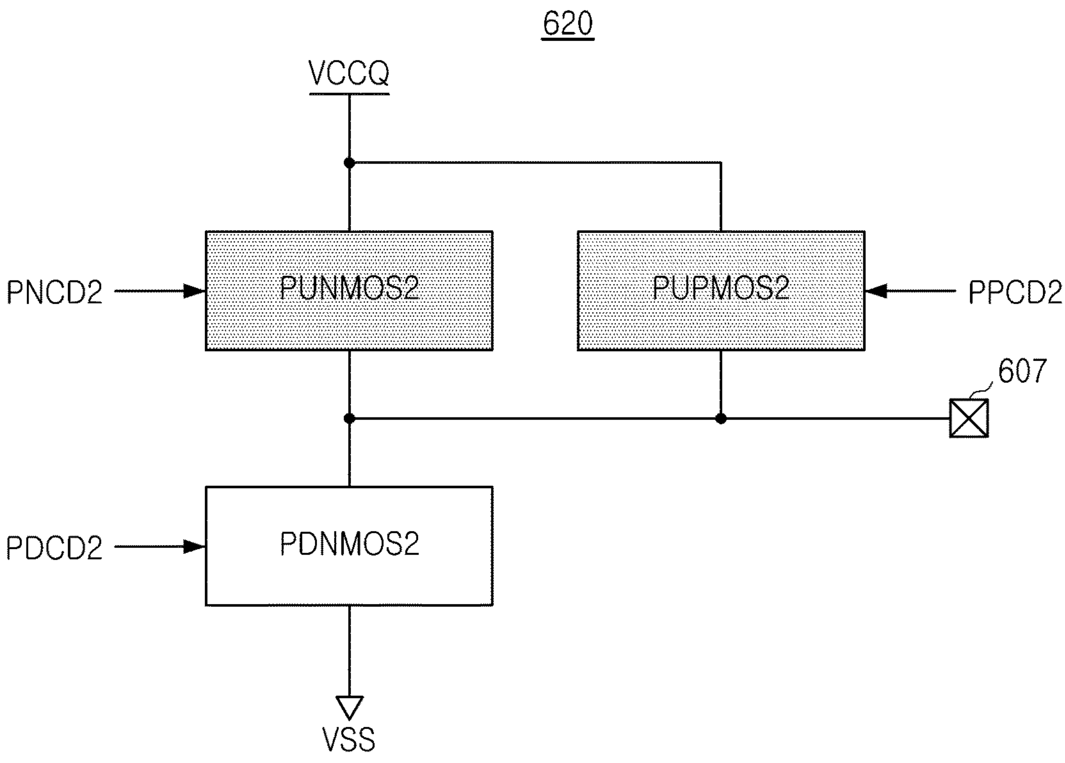

FIGS. 21 and 22 are views illustrating an operation of the first driver circuit 610 and an operation of the second driver circuit 620 in a rising period of the second signal OUTPUT2. Referring to FIGS. 21 and 22, during the rising period of the second signal OUTPUT2, a pull-down circuit PDNMOS1 may operate in the first driver circuit 610, and a first pull-up circuit PUNMOS2 and a second pull-up circuit PUPMOS2 may operate in the second driver circuit 620. As both the first pull-up circuit PUNMOS2 and the second pull-up circuit PUPMOS2 operate, pull-up resistance of the second driver circuit 620 may decrease and the second signal OUTPUT2 may increase faster. Therefore, the rising period of the second signal OUTPUT2 may also be shortened.

Figure 23:
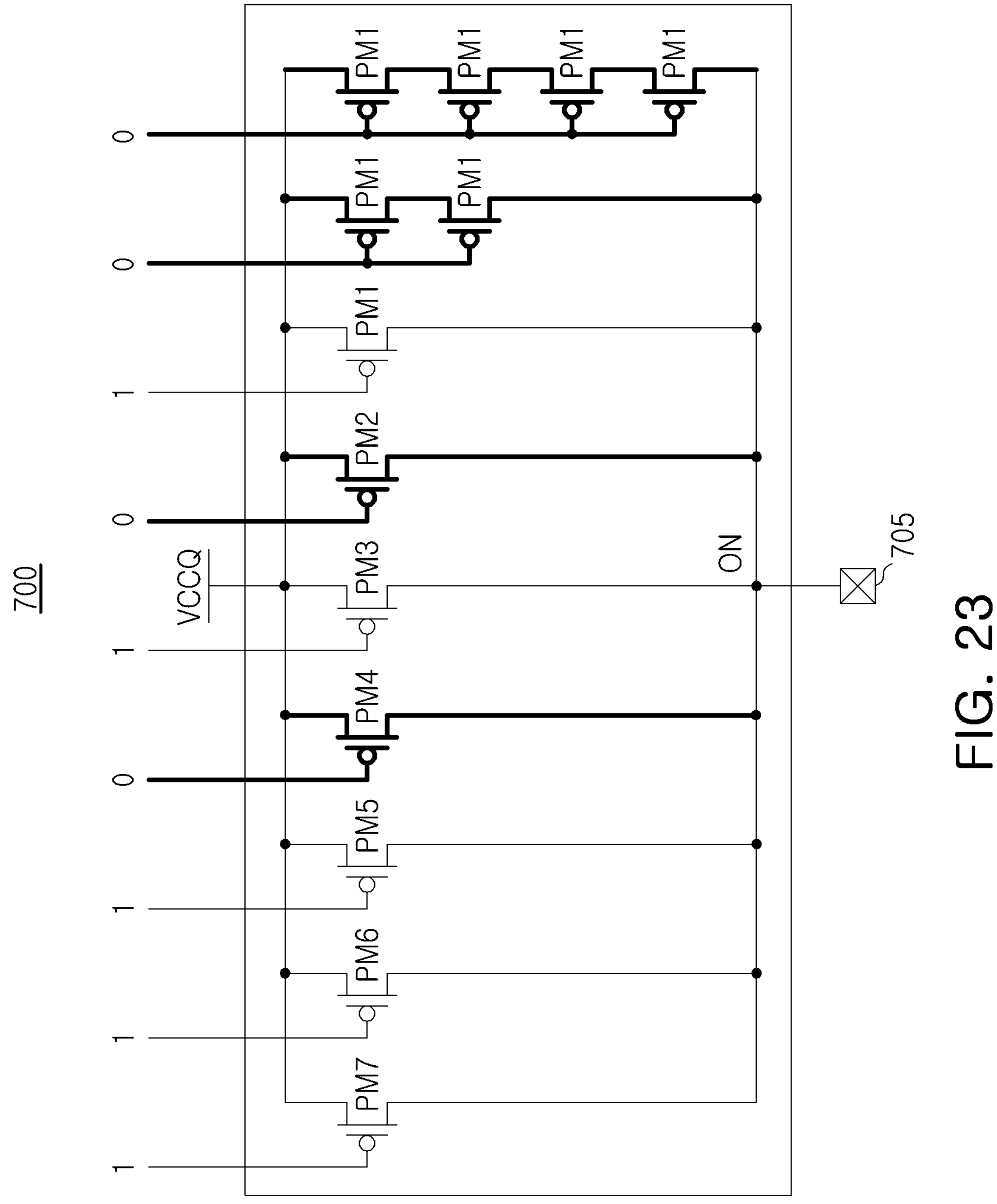
FIGS. 23 to 25 are views illustrating an operation of a semiconductor device according to embodiments.
Figure 24:
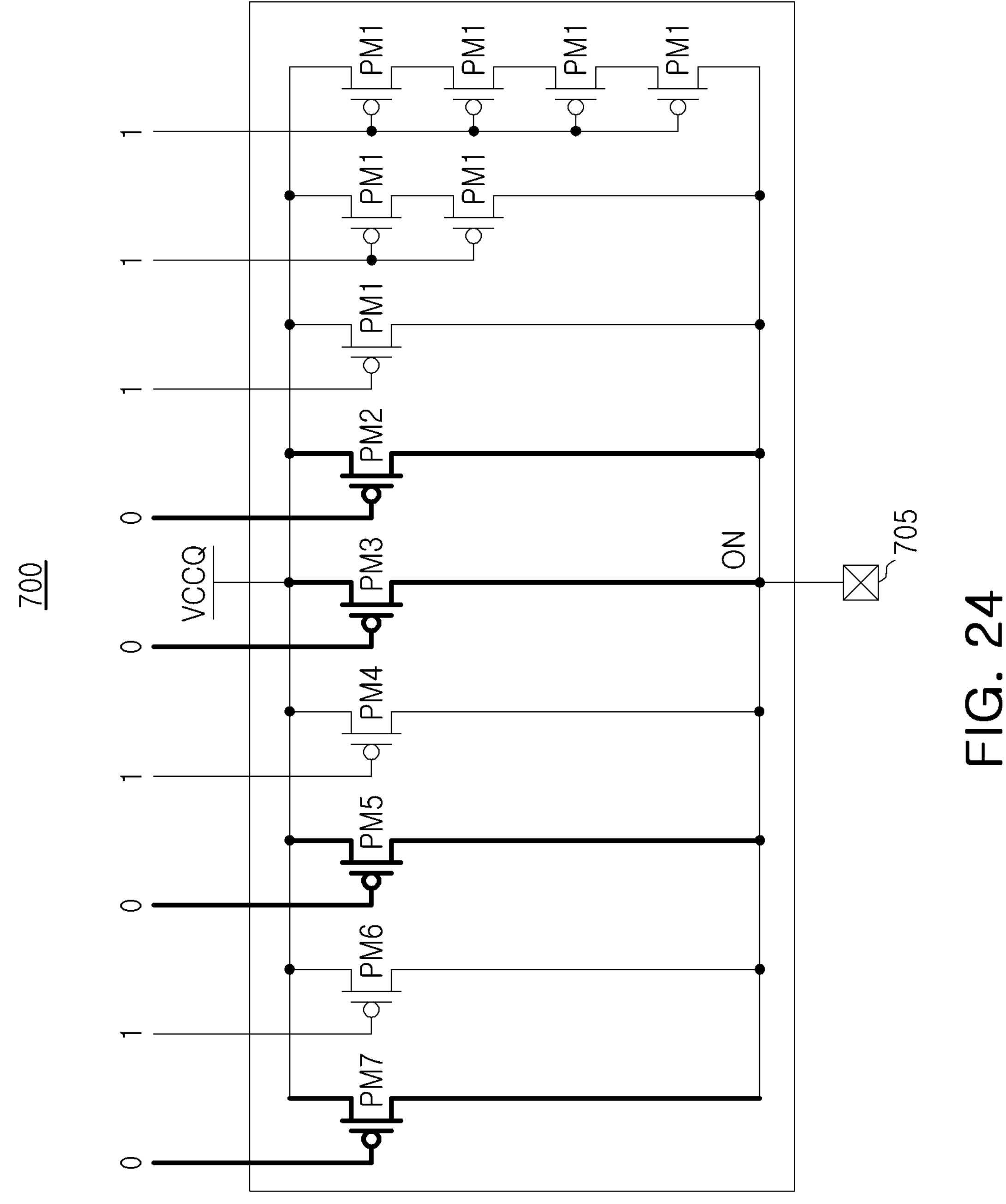
Figure 25:
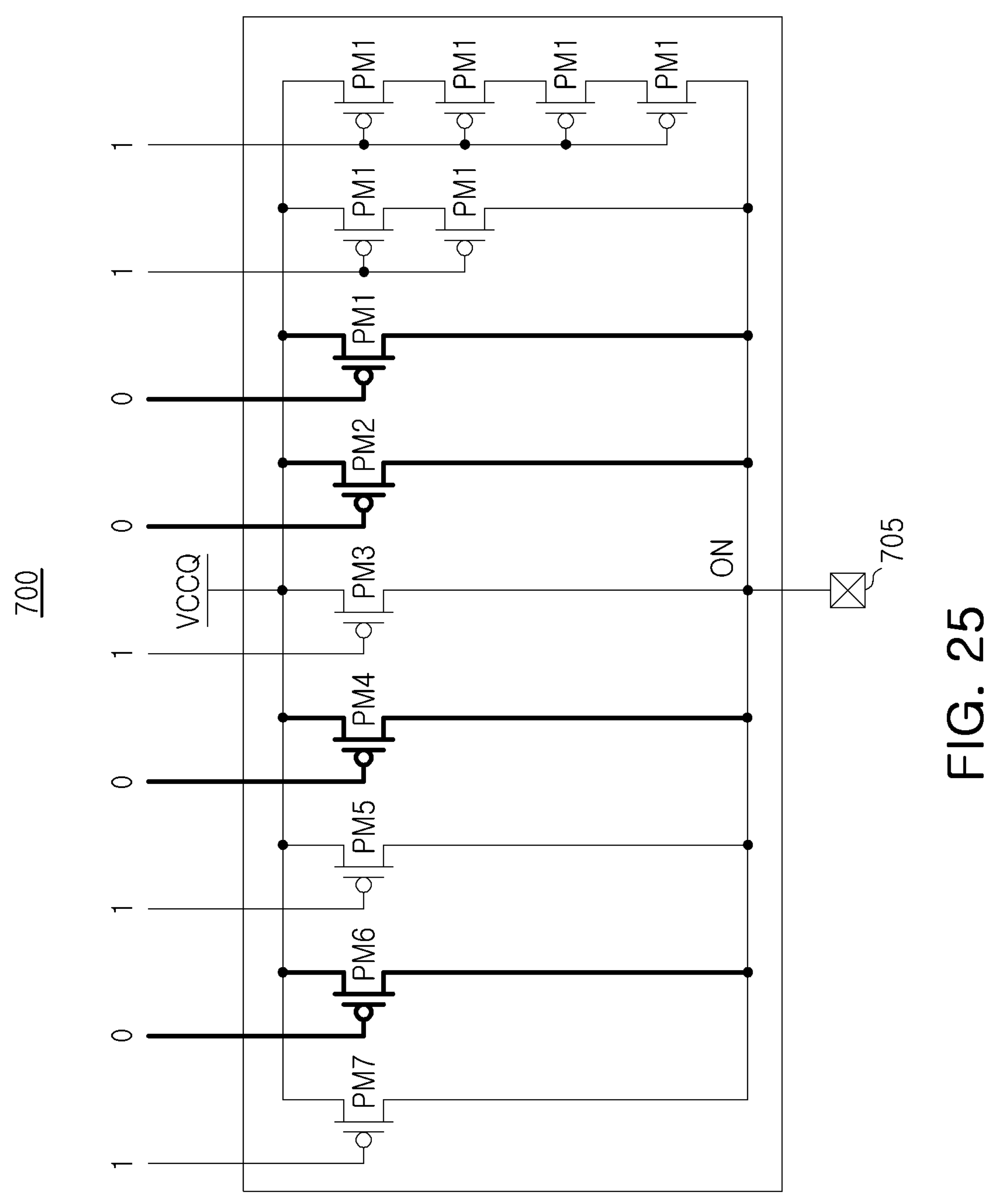

FIGS. 23 to 25 are views illustrating an operation of a semiconductor device according to embodiments.

FIGS. 23 to 25 are views illustrating an operation of a second pull-up circuit 700 included in a driver circuit in a semiconductor device according to an embodiment. The second pull-up circuit 700 may include a plurality of PMOS transistors PM1 to PM7, and at least some of the plurality of PMOS transistors PM1 to PM7 may be electrically connected in parallel to provide a plurality of current paths. The plurality of current paths may be provided between an output node ON and a first power node supplying a first power voltage VCCQ, and the output node ON may be connected to an output pad 705. Herein, the second pull-up circuit 700 and the output pad 705 may correspond to the second pull-up circuit 210 and the output pad 205 of FIG. 4.

A resistance value of the second pull-up circuit 700 may be determined by first to ninth control signals respectively input to gates of the plurality of PMOS transistors PM1 to PM7, and the first to ninth control signals may match bits of a second pull-up code input to the second pull-up circuit 700. In the embodiment illustrated in FIG. 23, the second pull-up code may include 9-bit data of [111010100].

When a rising period of a signal output to the output pad 705 increases, a control circuit may input the second pull-up code to the second pull-up circuit. As resistance of the second pull-up circuit receiving the second pull-up code is added between the first power node and the output pad 705, pull-up resistance of the driver circuit may be reduced, and a rising period of a signal may be shortened.

According to an embodiment, the rising period of the signal may not be sufficiently shortened with the second pull-up code as illustrated in FIG. 23. In this case, the control circuit may adjust the second pull-up code such that the resistance of the second pull-up circuit decreases. For example, the control circuit may decrease a value of the second pull-up code to [010100111], and may input the same to the second pull-up circuit 700 as illustrated in FIG. 24.

First to ninth current paths provided by the second pull-up circuit 700 may have different on-resistance. For example, the ninth current path may have the lowest on-resistance and the first current path may have the highest on-resistance. Therefore, a resistance value of the second pull-up circuit 700 in the embodiment illustrated in FIG. 24 may be lower than a resistance value of the second pull-up circuit 700 according to the embodiment illustrated in FIG. 23.

As a result, in the embodiment illustrated in FIG. 24, the second pull-up circuit 700 having lower resistance than the embodiment illustrated in FIG. 23 may be connected between the first power node and the output pad 705. Therefore, pull-up resistance of the driver circuit may be further reduced, and a rising period of a signal may be further shortened.

When the second pull-up code is adjusted as in the embodiment illustrated in FIG. 24, the rising period of the signal may be too shortened. In this case, the control circuit may increase a value of the second pull-up code, and may input the same to the second pull-up circuit 700 as illustrated in FIG. 25. As such, while the control circuit increases/decreases a resistance value of the second pull-up circuit 700 by adjusting the second pull-up code, the rising period of the signal output to the output pad 705 may be set to be similar to the target value.

In the embodiment described with reference to FIGS. 23 to 25, it has been described that the control circuit adjusts the second pull-up code in a code shift manner, but is not necessarily limited thereto. When the second pull-up code is 9-bit data, the control circuit may increase or decrease resistance of the second pull-up circuit 700 by adjusting the second pull-up code in units of bits.

According to an embodiment, a driver may include a first pull-up circuit and a second pull-up circuit, implemented with different devices. The first pull-up circuit may operate to increase a level of an output signal regardless of setting of the output signal, and the second pull-up circuit may operate to improve characteristics of a rising period increasing the level of the output signal according to the setting of the output signal. In this manner, SI characteristics of the output signal may be improved and power consumption of the semiconductor device may be reduced by reflecting the setting of the output signal changing according to an operation mode of the semiconductor device, to control the first pull-up circuit and the second pull-up circuit.

Various advantages and effects of the present inventive concept are not limited to the above description, and will be more easily understood in the process of describing specific embodiments of the present inventive concept.

While embodiments have been illustrated and described above, it will be apparent to those skilled in the art that modifications and variations could be made without departing from the scope of the present inventive concept as defined by the appended claims.

What is claimed is:

1. A semiconductor device comprising:

a pull-up circuit connected between a first power node supplying a first power voltage and an output node through which a signal is output;

a pull-down circuit connected between a second power node supplying a second power voltage, lower than the first power voltage, and the output node; and a control circuit configured to control the pull-up circuit and the pull-down circuit, wherein the pull-up circuit includes:

a first pull-up circuit including a plurality of NMOS transistors connected between the first power node and the output node, and a second pull-up circuit including a plurality of PMOS transistors connected between the first power node and the output node, and wherein, in a first operating mode of the semiconductor device:

the signal swings between a first low level, corresponding to the second power voltage, and a first high level lower than the first power voltage, the control circuit is configured to output a first pull-up code to the first pull-up circuit, and output a second pull-up code to the second pull-up circuit, at least one of the plurality of PMOS transistors of the second pull-up circuit is configured to turn on based on the second pull-up code, a first time period for the control circuit to input the first pull-up code to the first pull-up circuit is longer than a second time period for the control circuit to input the second pull-up code to the second pull-up circuit, the first pull-up circuit is configured to activate in response to the first pull-up code in the first time period, and the second pull-up circuit is configured to activate in response to the second pull-up code in the second time period.

2. The semiconductor device of claim 1, wherein, in the first operation mode, the semiconductor device is configured such that the control circuit:

adjusts the second pull-up code to decrease resistance of the second pull-up circuit when a duty ratio of the signal is less than 50%, and adjusts the second pull-up code to increase resistance of the second pull-up circuit when a duty ratio of the signal is greater than 50%.

3. The semiconductor device of claim 2, wherein the control circuit is configured to:

decrease a value of the second pull-up code when the duty ratio of the signal is lower than 50%, and increase a value of the second pull-up code when the duty ratio of the signal is higher than 50%.

4. The semiconductor device of claim 1, wherein a time period at which the control circuit outputs the second pull-up code to the second pull-up circuit overlaps a rising period of the signal.

5. The semiconductor device of claim 1, wherein the number of bits of the first pull-up code is equal to the number of bits of the second pull-up code.

6. The semiconductor device of claim 1, wherein, in a second operating mode of the semiconductor device:

the signal swings between a second low level higher than the second power voltage, and a second high level lower than the first power voltage, and the control circuit is configured to output a fixed code to the second pull-up circuit.

7. The semiconductor device of claim 6, wherein the second low level is equal to the first high level.

8. The semiconductor device of claim 1, wherein the first high level is ⅓ times the first power voltage.

9. The semiconductor device of claim 1, wherein the control circuit includes:

a buffer including a first input terminal configured to receive the signal, a second input terminal configured to receive a complementary signal complementary to the signal, and an output terminal configured to output an output signal, a charge pump circuit configured to perform a charging operation or a discharging operation in response to the output signal of the buffer, a comparator configured to compare an output voltage of the charge pump circuit with a reference voltage, and a counter configured to output the second pull-up code based on a comparison result of the comparator.

10. The semiconductor device of claim 9, wherein the output signal of the buffer is a digital signal swinging between a ground voltage and a power voltage, and wherein a level of the reference voltage is ½ times a level of the power voltage.

11. A semiconductor device comprising:

a first driver circuit including a pull-up circuit and a pull-down circuit, and configured to output a first signal to a first pad;

a second driver circuit including a pull-up circuit and a pull-down circuit, and configured to output a second signal, complementary to the first signal, to a second pad different from the first pad; and a control circuit configured to control the first driver circuit and the second driver circuit, wherein the control circuit includes:

a buffer including input terminals connected to the first pad and the second pad and an output terminal configured to output a digital signal based on a difference between the first signal and the second signal, an integrator configured to operate in response to the digital signal, a comparator configured to compare an output voltage of the integrator with a reference voltage, and a counter configured to output an N-bit code based on a comparison result of the comparator, N being a natural number equal to or greater than 2, wherein resistance of the pull-up circuit of the first driver circuit and resistance of the pull-up circuit of the second driver circuit are adjusted based on the N-bit code.

12. The semiconductor device of claim 11, wherein the integrator includes a plurality of pumping capacitors configured to be charged or discharged based on the digital signal.

13. The semiconductor device of claim 11, wherein, when the output voltage of the integrator is higher than the reference voltage, the semiconductor device is configured such that the counter outputs the N-bit code to increase the resistance of the pull-up circuit of each of the first driver circuit and the second driver circuit.

14. The semiconductor device of claim 11, wherein, when the output voltage of the integrator is lower than the reference voltage, the semiconductor device is configured such that the counter outputs the N-bit code to decrease the resistance of the pull-up circuit of each of the first driver circuit and the second driver circuit.

15. The semiconductor device of claim 11, wherein the buffer is a fully differential amplifier.

16. The semiconductor device of claim 11, wherein the pull-up circuit of each of the first driver circuit and the second driver circuit includes a first pull-up circuit including a plurality of NMOS transistors and a second pull-up circuit including a plurality of PMOS transistors, wherein the first pull-up circuit and the second pull-up circuit of each of the first driver circuit and the second driver circuit are respectively connected in parallel to each other, and wherein the N-bit code is input to the second pull-up circuit of each of the first driver circuit and the second driver circuit.

17. The semiconductor device of claim 16, wherein the control circuit is configured to output a code determined in a ZQ calibration operation of the semiconductor device to the first pull-up circuit of each of the first driver circuit and the second driver circuit.

18. A semiconductor device comprising:

a pull-up circuit including:

a first pull-up circuit connected between a first power node supplying a first power voltage and an output node through which a signal is output, and including a plurality of NMOS transistors, and a second pull-up circuit connected in parallel to the first pull-up circuit between the first power node and the output node and including a plurality of PMOS transistors; and a control circuit configured to output a first pull-up code to the first pull-up circuit and output a second pull-up code to the second pull-up circuit, wherein, in a first operating mode of the semiconductor device:

the signal swings between a first low level corresponding to a second power voltage, lower than the first power voltage, and a first high level, lower than ½ times the first power voltage, resistance of the first pull-up circuit is determined based on the first pull-up code, and resistance of the second pull-up circuit is determined based on the second pull-up code, total resistance of the pull-up circuit is less than the resistance of the first pull-up circuit and the resistance of the second pull-up circuit, and the first high level is the maximum voltage level of the signal.

19. The semiconductor device of claim 18, further comprising:

a pull-down circuit connected between a second power node supplying the second power voltage and the output node and including a plurality of NMOS transistors.

* * * * *